(12) United States Patent
Matsuda et al.

(10) Patent No.: US 8,603,892 B2
(45) Date of Patent: Dec. 10, 2013

(54) METHOD OF MANUFACTURING A SEMICONDUCTOR DEVICE

(75) Inventors: Yoh Matsuda, Tokyo (JP); Kyoko Miyata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/414,320

(22) Filed: Mar. 7, 2012

(65) Prior Publication Data
US 2012/0164816 A1 Jun. 28, 2012

Related U.S. Application Data

(62) Division of application No. 12/639,450, filed on Dec. 16, 2009, now Pat. No. 8,154,102.

(30) Foreign Application Priority Data

Dec. 16, 2008 (JP) ................................. 2008-320255
Nov. 17, 2009 (JP) ................................. 2009-261744

(51) Int. Cl.
*H01L 21/76* (2006.01)
(52) U.S. Cl.
USPC ............ 438/424; 257/E21.545; 257/E21.547; 257/E21.657

(58) Field of Classification Search
USPC .................................................. 257/E21.657
See application file for complete search history.

(56) References Cited

U.S. PATENT DOCUMENTS

| 7,413,987 B2 | 8/2008 | Hieda et al. | |
|---|---|---|---|
| 2005/0074965 A1* | 4/2005 | Lee et al. | 438/627 |
| 2005/0112869 A1* | 5/2005 | Lee et al. | 438/631 |
| 2005/0170606 A1* | 8/2005 | Fu et al. | 438/424 |
| 2006/0091451 A1* | 5/2006 | Yamaguchi et al. | 257/316 |
| 2009/0096055 A1 | 4/2009 | Montgomery et al. | |

FOREIGN PATENT DOCUMENTS

| JP | 2004-179614 | 6/2004 |
|---|---|---|
| JP | 2005-347636 | 12/2005 |

* cited by examiner

*Primary Examiner* — Daniel Whalen
(74) *Attorney, Agent, or Firm* — Young & Thompson

(57) ABSTRACT

A semiconductor device includes groove-like regions that are formed between two adjacent bit lines among a plurality of bit lines each having upper and side surfaces covered with a cap insulating film and a side-wall insulating film, respectively, a SiON film that contains more O (oxygen) than N (nitrogen) and continuously covers inner surfaces of the groove-like regions, and a silicon dioxide film formed by reforming polysilazane and filled in the groove-like regions with the SiON film interposed therebetween.

20 Claims, 20 Drawing Sheets

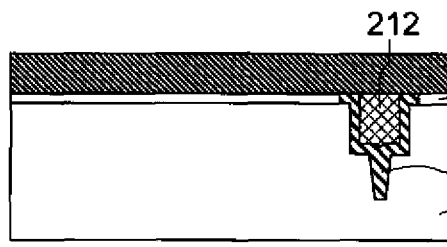 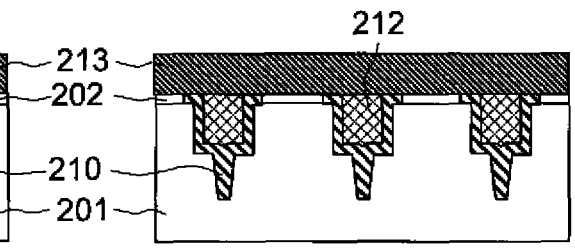
FIG.12A    FIG.12B
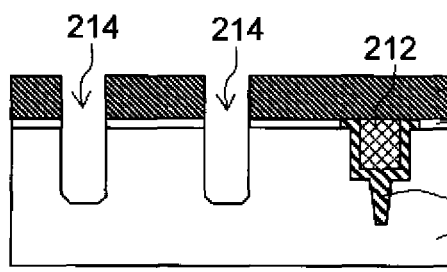 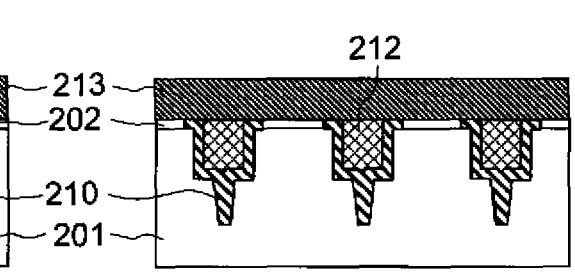
FIG.13A    FIG.13B
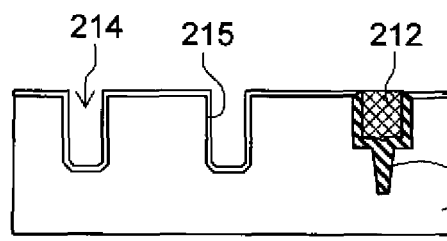 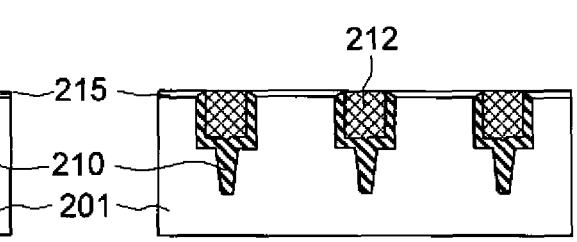
FIG.14A    FIG.14B
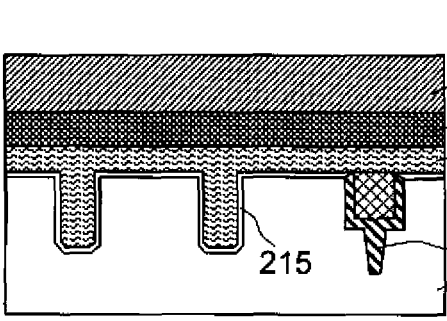 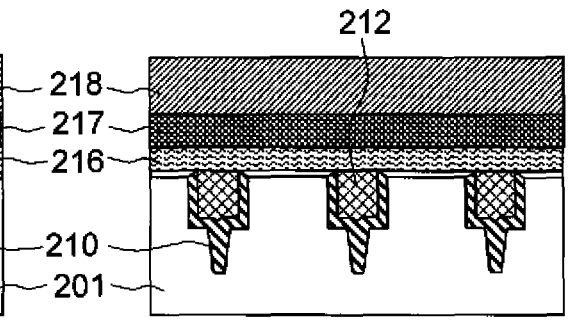
FIG.15A    FIG.15B

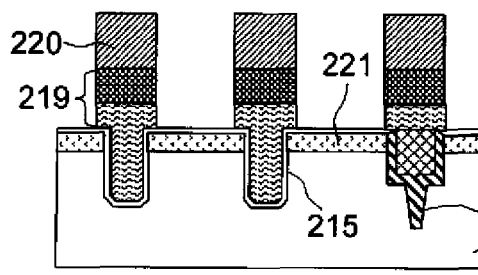
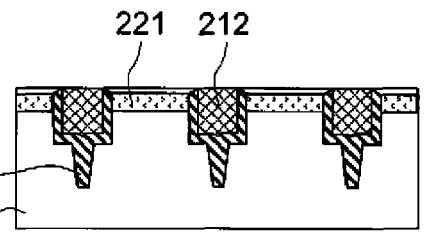
FIG.16A  FIG.16B
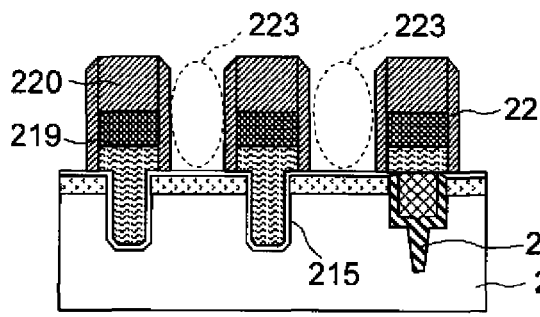
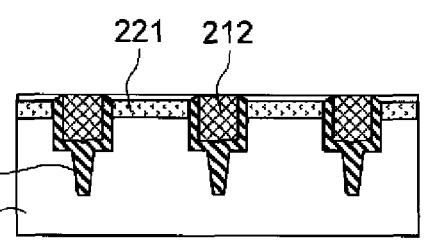
FIG.17A  FIG.17B
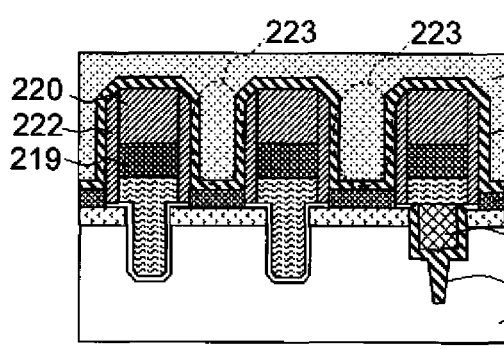
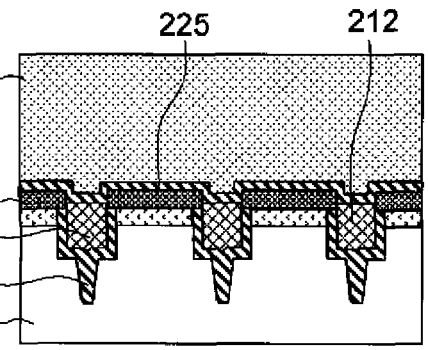
FIG.18A  FIG.18B
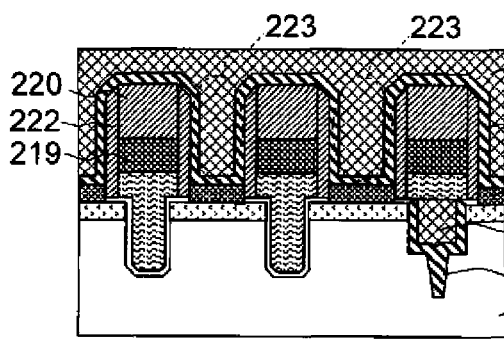
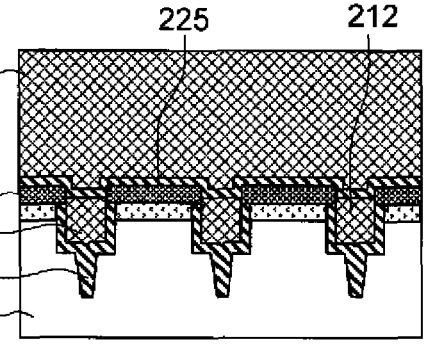
FIG.19A  FIG.19B

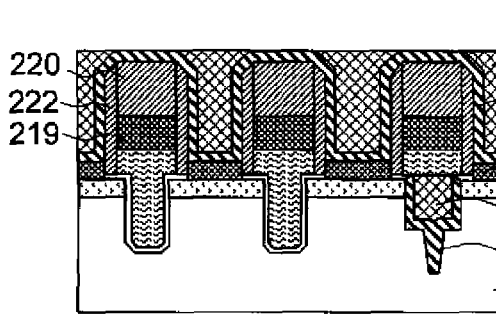
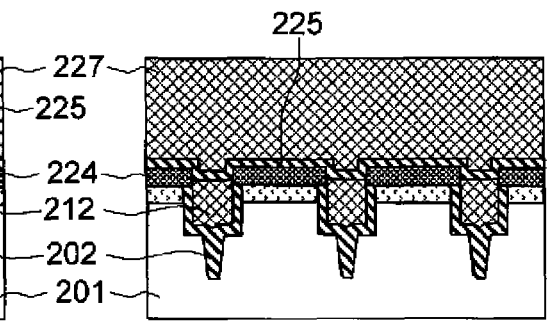
FIG.20A  FIG.20B
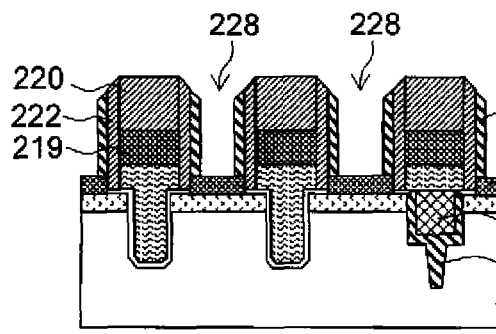
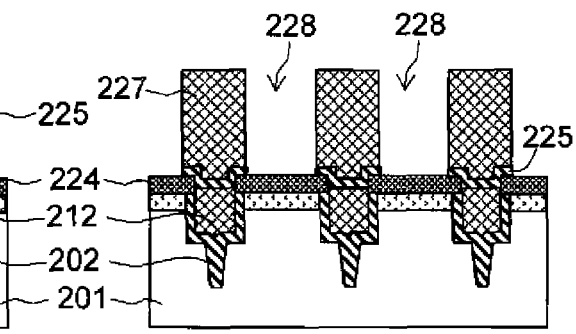
FIG.21A  FIG.21B
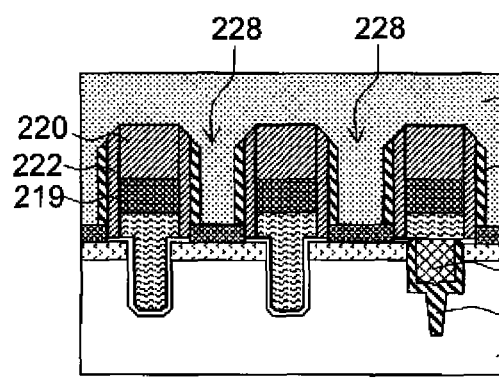
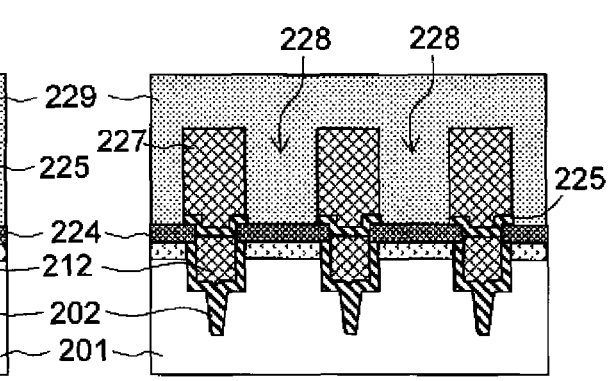
FIG.22A  FIG.22B

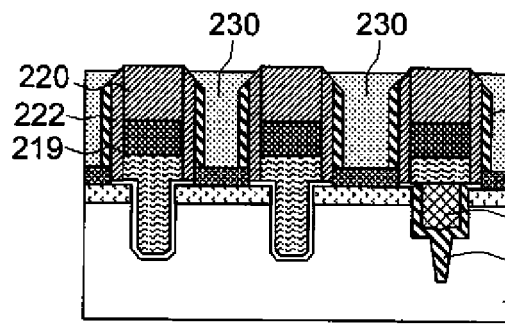
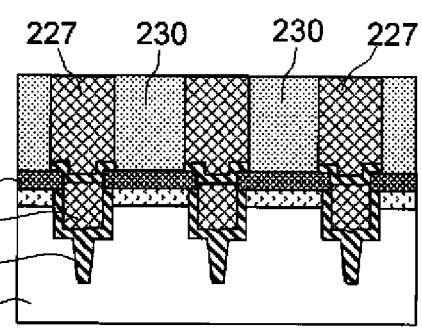
FIG.23A　　　　　　FIG.23B
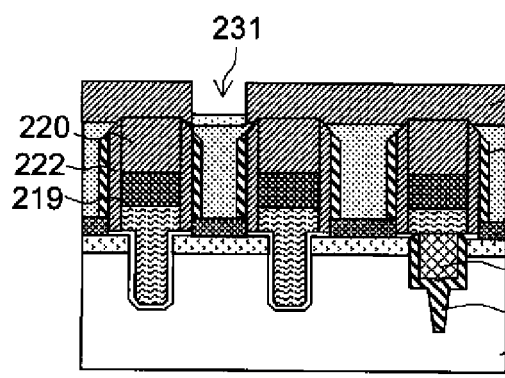
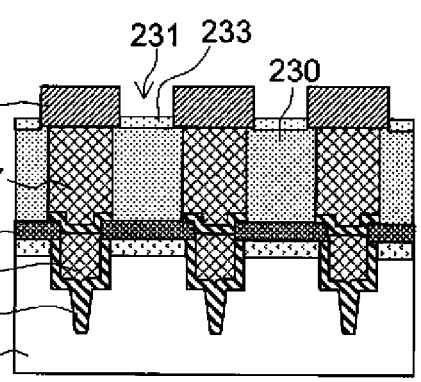
FIG.24A　　　　　　FIG.24B
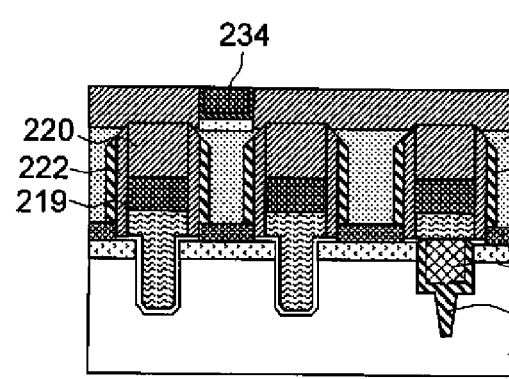
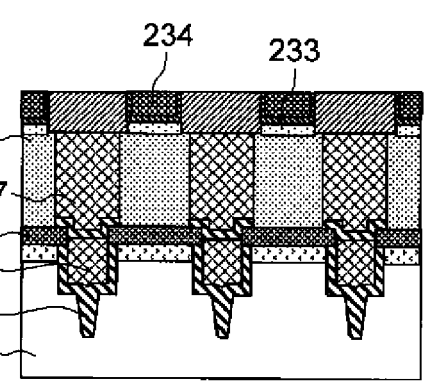
FIG.25A　　　　　　FIG.25B

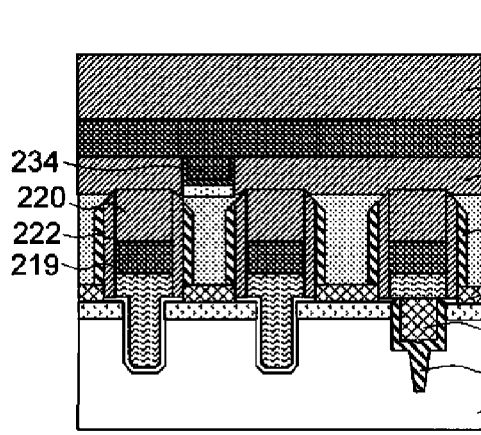
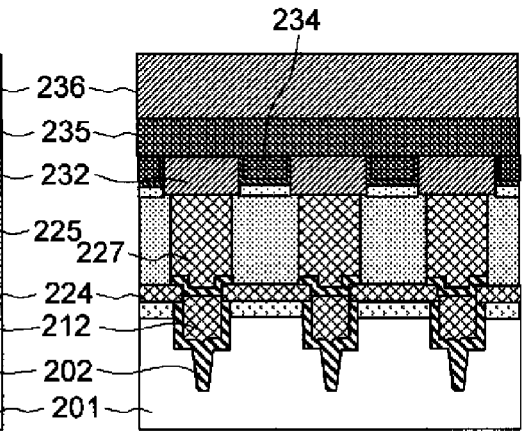
FIG.26A  FIG.26B
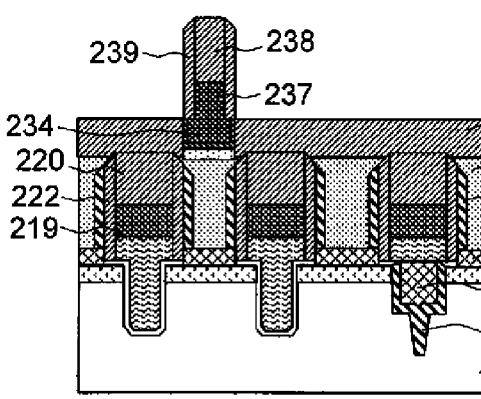
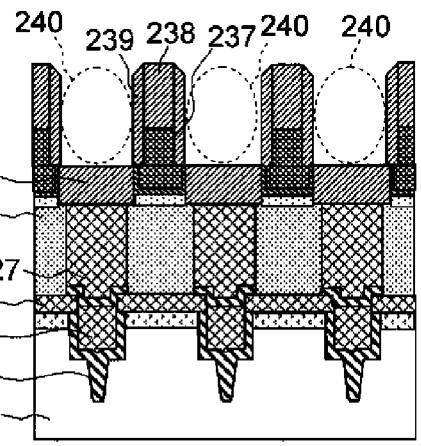
FIG.27A  FIG.27B
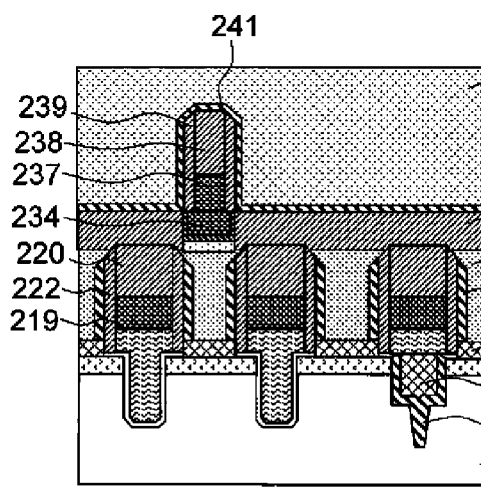
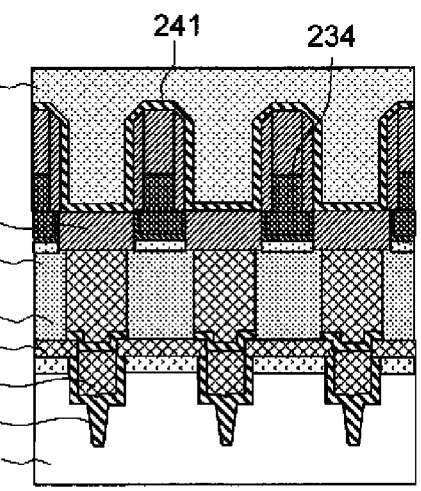
FIG.28A  FIG.28B

METHOD OF MANUFACTURING A SEMICONDUCTOR DEVICE

CROSS REFERENCE TO RELATED APPLICATIONS

This application is a division of co-pending application Ser. No. 12/639,450 filed on Dec. 16, 2009, which claims foreign priority to Japanese application Nos. 2008-320255 and 2009-261744 filed on Dec. 16, 2008 and Nov. 17, 2009, respectively. The entire content of each of these applications is hereby expressly incorporated by reference.

BACKGROUND OF THE INVENTION

1. Field of the Invention

The present invention relates to a semiconductor device and a manufacturing method thereof, and, more particularly relates to a semiconductor device having insulating films formed by using polysilazane and a manufacturing method of the semiconductor device.

2. Description of Related Art

Conventionally, in manufacturing process of a semiconductor device, insulating films in narrow regions such as an STI (Shallow Trench Isolation) trench and a space between gate electrodes or bit lines are formed by means of a HDP-CVD (High Density Plasma-Chemical Vapor Deposition) method, depositing BPSG (Boron Phosphorus Silicon Glass) and reflowing the deposited BPSG, or the like. With downsizing of elements, however, the STI trenches or the spaces between gate electrodes or bit lines have become narrower and accordingly it has become difficult to form the insulating films in these regions by the method mentioned above.

FIG. 39 is a schematic cross-sectional view showing an example in which a silicon dioxide film is formed between bit lines by the HDP-CVD method. As shown in FIG. 39, cell contacts 502 are formed in a first interlayer insulating film 501, and a second interlayer insulating film 504 and bit contacts 505 are formed thereon. Bit lines 506 are formed on the bit contacts 505, and a cap insulating film 507 and a side-wall insulating film 508 are formed on upper and side surfaces of each of the bit lines 506, respectively. A metal silicide film 503 is formed on an upper surface of each of the cell contacts 502 to reduce contact resistance between the cell contact 502 and the adjacent bit contact 505. A silicon dioxide film 509 is formed by the HDP-CVD method to fill spaces between the bit lines 506. However, voids 510 are adversely produced in the narrow spaces between the bit lines 506.

Consequently, there has been a need to use polysilazane with a satisfactory filling capability to form a silicon dioxide film in such narrow regions (see, for example, Japanese Patent Application Laid-open Nos. 2005-347636 and 2004-179614).

To form a silicon dioxide film by using polysilazane, it is necessary to apply a polysilazane solution by spin coating, perform annealing (steaming) in a steam ($H_2O$) atmosphere, and then reform the polysilazane into a silicon dioxide film with a high density. This is for a following reason. Because the polysilazane includes a composition of "—$SiH_2NH$—", coating of the polysilazane solution and subsequent heat treatment in a nonoxidizing atmosphere such as nitrogen atmosphere produces a silicon nitride film. The silicon nitride film, however, has a great stress and is improper to be used as an interlayer insulating film. Therefore, it is necessary to perform the annealing in the steam atmosphere (oxidizing atmosphere) after coating of the polysilazane, thereby removing N in the coated film and reforming the film into a silicon dioxide film. However, the steaming may oxidize a metal film, a polycrystalline silicon film, or a silicon substrate in lower layers. For example, when the silicon dioxide film in the semiconductor device having the structure shown in FIG. 39 is formed by using the polysilazane instead of by the HDP-CVD method, the metal silicide film 503 is oxidized and resistance is increased. Therefore, an oxidation-resistant liner film needs to be formed before coating of the polysilazane.

FIG. 40 shows an example in which a silicon nitride film is used as an oxidation-resistant liner film and a silicon dioxide film is made of polysilazane. In FIG. 40, constituent elements identical to those in FIG. 39 are denoted by like reference numerals and explanations thereof are omitted. As shown in FIG. 40, a silicon nitride film 601 is continuously formed on surfaces of the cap insulating film 507 and the side-wall insulating film 508 covering the bit lines 506, and on parts of an upper surface of the second interlayer insulating film 504 exposed between the bit lines 506. Polysilazane is coated thereon and then annealing is performed in a steam atmosphere, thereby forming a silicon dioxide film 602.

However, it has been found that the polysilazane in narrow groove-like regions 603 (see FIG. 40) between the bit lines 506 is not adequately reformed by the steaming when the silicon nitride film is used as the liner film 601 for the polysilazane.

FIG. 41 shows the semiconductor device shown in FIG. 40 after being steamed, then cut in section as shown, and treated with a hydrofluoric acid. As shown in FIG. 41, the polysilazane above the cap insulating film 507 is adequately reformed into a dense silicon dioxide film, and therefore remains hardly etched in the treatment with the hydrofluoric acid. On the other hand, a plurality of voids 604 is formed in the groove-like regions 603 between the bit lines 506. That is, the polysilazane in the regions 603 is not adequately reformed into a dense silicon dioxide film, and there remain parts having quite high etching rates in the treatment with the hydrofluoric acid than in the other parts adequately reformed, which are etched to form the voids 604.

It is considered that a reason why the polysilazane is adequately reformed is that outgassing of ammonia ($NH_3$) from a surface of the silicon nitride film 601 as the liner film occurs during the steaming, which prevents Si—N bonds in the polysilazane from being substituted for Si—O bonds.

When the silicon dioxide film inadequately reformed is used as an interlayer insulating film, the interlayer insulating film is etched horizontally, that is, so as to form the voids 604 as shown in FIG. 41, during etching of the interlayer insulating film for contact hole formation, for example. When a plug material is subsequently formed in the contact holes, the plug material is filled also in the voids and adjacent contact plugs are short-circuited.

The conventional problems have been explained using the example in which the polysilazane is used to fill a silicon dioxide film between bit lines of a DRAM (Dynamic Random Access Memory). These problems can also occur in narrow regions between gate electrodes, STI regions, and the like.

SUMMARY

In one embodiment, there is provided a semiconductor device having groove-like regions, comprising; a SiON film that contains more O (oxygen) than N (nitrogen) and continuously covers inner surfaces of the groove-like regions; and a silicon dioxide film that is formed by reforming polysilazane and is filled in the groove-like regions with the SiON film interposed therebetween.

In another embodiment, there is provided a manufacturing method of a semiconductor device comprising: forming groove-like regions; forming a SiON film that contains more O (oxygen) than N (nitrogen) to continuously cover inner surfaces of the groove-like regions; filling the groove-like regions with polysilazane with the SiON film interposed therebetween; and reforming the polysilazane by heat treatment.

According to the present invention, generation of $NH_3$ that prevents Si—N bonds in the polysilazane from being substituted for Si—O bonds during steaming for reforming the polysilazane is suppressed by using a SiON film having a rate of N content in the SiON film in a range of 10 to 20% and containing more O than N as a liner film. Consequently, efficiency of reforming of the polysilazane into the silicon dioxide film can be enhanced. Further, the SiON film with this composition has oxidation resistance to prevent diffusion of an oxidation. Therefore, it is possible to prevent a metal film such as a metal silicide for reducing contact resistance between cell contacts and bit contacts formed in lower layers, a silicon substrate, or the like from being oxidized by steaming.

BRIEF DESCRIPTION OF THE DRAWINGS

The above features and advantages of the present invention will be more apparent from the following description of certain preferred embodiments taken in conjunction with the accompanying drawings, in which:

FIGS. 4A to 32A show schematic cross-sectional views along a line A-A in FIG. 3, respectively;

FIGS. 4B to 32B show schematic cross-sectional views along a line B-B in FIG. 3, respectively;

DETAILED DESCRIPTION OF THE EMBODIMENTS

Preferred embodiments of the present invention will be explained below in detail with reference to the accompanying drawings.

Figure 1:
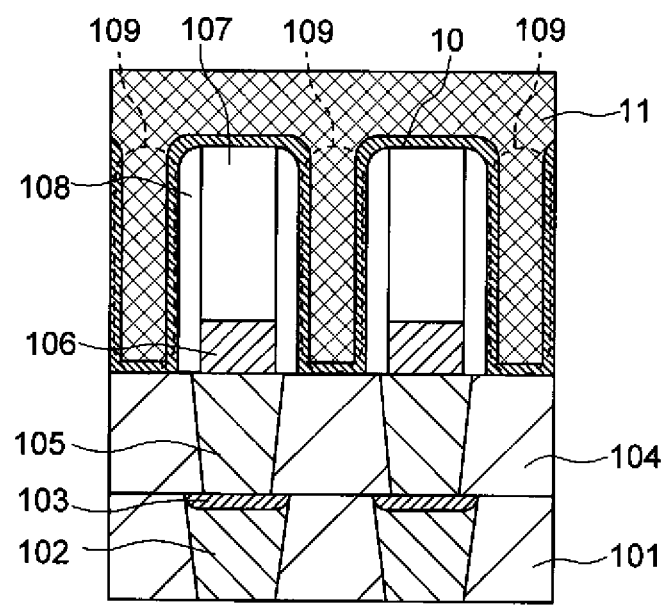
FIG. 1 is a schematic cross-sectional view showing a structure of a semiconductor device 100 according to an embodiment of the present invention.

FIG. 1 is a schematic cross-sectional view showing a structure of a semiconductor device 100 according to an embodiment of the present invention. The semiconductor device 100 according to the embodiment is a DRAM and FIG. 1 shows a structure when formation of an interlayer insulating film between bit lines is completed.

As shown in FIG. 1, the semiconductor device 100 includes groove-like regions 109 between bit lines 106, a SiON film 10 continuously covering inner surfaces of the groove-like regions 109 and acting as a liner film, and a silicon dioxide film 11 filled in the groove-like regions 109 with the SiON film 10 interposed therebetween and formed by reforming polysilazane to act as an interlayer insulating film.

Specifically, cell contacts 102 are formed in a first interlayer insulating film 101 provided on a silicon substrate (not shown), and a second interlayer insulating film 104 and bit contacts 105 are formed thereon. The bit lines 106 are formed on the bit contacts 105, and a cap insulating film 107 and a side-wall insulating film 108 are formed on upper and side surfaces of each of the bit lines 106, respectively. A metal silicide film 103 is formed on an upper surface of each of the cell contacts 102 to reduce contact resistance between the cell contact 102 and the adjacent bit contact 105.

Figure 41:
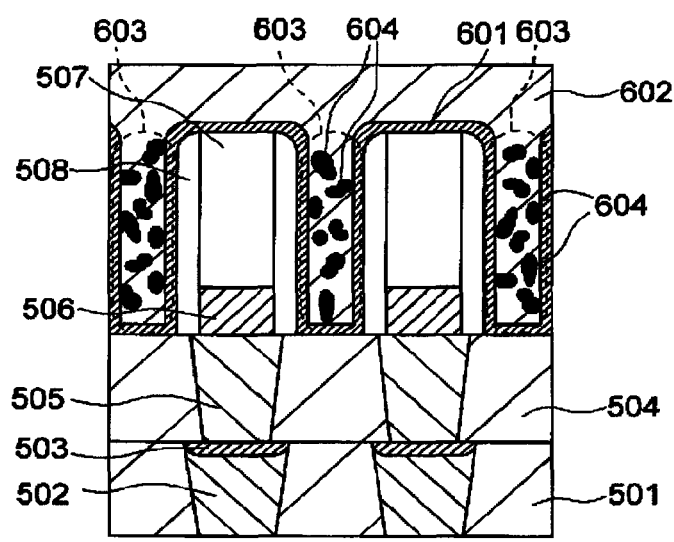
FIG. 41 shows the semiconductor device shown in FIG. 40 after being steamed, then cut in section as shown, and treated with a hydrofluoric acid.

The SiON film 10 is formed continuously on upper surfaces of the cap insulating film 107 and side surfaces of the side-wall insulating film 108, which are formed on the bit lines 106, and on parts of an upper surface of the second interlayer insulating film 104 exposed at bottoms of the groove-like regions 109. The SiON film 10 contains more O (oxygen) than N (nitrogen). The SiON film 10 contains N preferably at a content rate of 10 to 20 atom %, more preferably at a content rate of 14 to 17 atom %. A ratio in atom number of O to N is preferably 2.2 to 5.5, more preferably 2.8 to 3.5. If the rate of N content in the SiON film is smaller than 10 atom % and the ratio in atom number of O to N is larger than 5.5, a stopping power for oxidant diffusion of the SiON film is reduced, which makes difficult to prevent oxidation of a metal film or a silicon film located in layers below the SiON film. If the rate of N content in the SiON film is larger than 20 atom % and the ratio in atom number of O to N is smaller than 2.2, the polysilazane formed in the groove-like regions 109 is inadequately reformed, and accordingly it is difficult to avoid occurrence of the voids 604 shown in FIG. 41.

Figure 2:
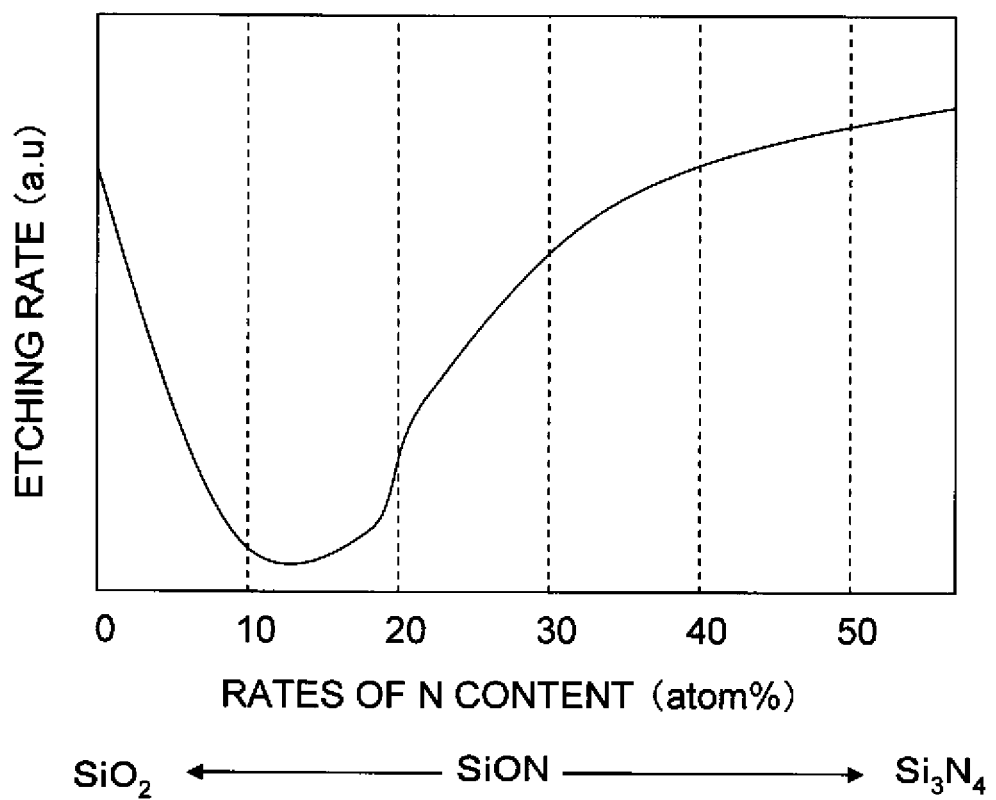
FIG. 2 shows results of an examination of an etching rate of the silicon dioxide film 11 formed in the groove-like regions 109 to illustrate an effect of the rate of N content in the SiON film with respect to reforming of the polysilazane.

FIG. 2 shows results of an examination of an etching rate of the silicon dioxide film 11 formed in the groove-like regions 109 to illustrate an effect of the rate of N content in the SiON film with respect to reforming of the polysilazane. The etching rates in the groove-like regions 109 are obtained by a method explained below. In the semiconductor device 100 shown in FIG. 1, the SiON film 10 and the polysilazane are first formed, the polysilazane is transformed into the silicon dioxide film 11 by steam reforming, and then a silicon film (not shown in FIG. 1) is formed on an entire surface of the silicon dioxide film 11. This test specimen is cut in section as shown in FIG. 1 and dipped into a hydrofluoric acid solution for a certain period of time. Because the silicon film is not etched, the silicon dioxide film 11 is etched only from a surface of the section in a depth direction (in a perpendicular direction on the drawing. The silicon film formed on the surface is then selectively removed. The treatment with the hydrofluoric acid causes the silicon dioxide film in the groove-like regions 109 to be etched, thereby forming voids. The lengths (depths) of the voids from the section are measured with a scanning electron microscope and etching rates are calculated by using the dipping period. FIG. 2 shows results of this empirical test conducted on SiON films with various rates of N content. The rates of N content in the formed SiON film are obtained by a photoelectron spectroscopy, which is used for a normal composition analysis. Because the SiON film formed by a thermochemical reaction is a mixed film including $SiO_2$ (silicon dioxide film) and $Si_3N_4$ (silicon nitride film), FIG. 2 also show results of the empirical test conducted on $SiO_2$ (containing no N) and $Si_3N_4$ (the rate of N content therein is 57 atom %).

As is obvious from FIG. 2, when the liner film is $Si_2N_4$, the etching rate is high depending on great occurrence of voids. The etching rate in this case is 1200 nm/min. With reduction in the N content rate, the etching rate is lowered and has a minimum value of 400 nm/min when the N content rate is 13 atom %. When the N content rate is reduced further, the etching rate is increased again. When the liner film is $SiO_2$, the etching rate is increased up to 750 nm/min. Occurrence of voids is not observed when the N content rate is 20 atom % or lower. Therefore, it implies that the increase in the etching rate at the N content rate of 10 atom % or lower is caused by a factor other than occurrence of voids; however, its detailed mechanism is unknown. Acceptable etching rates to be used in practical manufacturing of a semiconductor device are those at the N content rates in a range of 7 to 20 atom %. However, as described above, if the N content rate is smaller than 10 atom %, the stopping power for oxidation diffusion is reduced and the metal film or the silicon film located in layers below the SiON film is unfavorably oxidized. Therefore, a preferable range of the rate of N content in the SiON film is 10 to 20 atom % in the present invention.

A method of manufacturing a semiconductor device 200 according to the embodiment of the present invention is explained. In the present embodiment, the present invention is applied to manufacturing of a DRAM.

Figure 3:
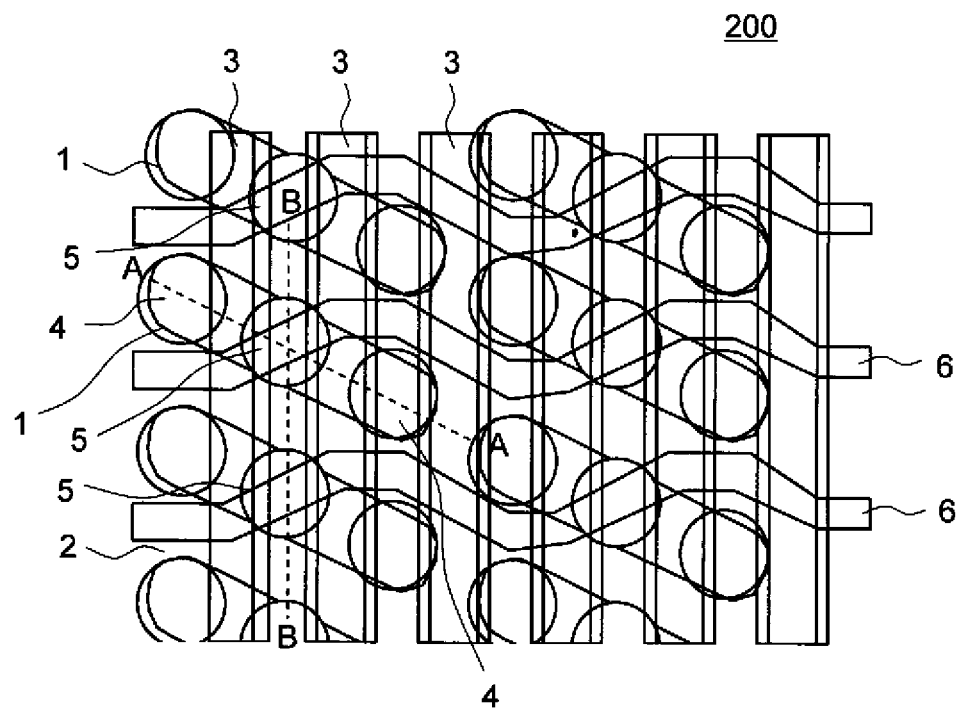
FIG. 3 is a schematic plan view for explaining a method of manufacturing a semiconductor device according to the present embodiment.

FIG. 3 is a schematic plan view for explaining a method of manufacturing a semiconductor device according to the present embodiment.

As shown in FIG. 3, in the semiconductor device 200 according to the present embodiment, a plurality of active regions 1 are partitioned by an STI region 2. On the active regions 1, a plurality of word lines (gate electrodes) 3 are provided to intersect with the active regions 1. Cell contacts 4 for capacitance contacts are provided on both ends of each of the active regions 1, and a cell contact 5 for bit contact is provided at the center of each active region 1. Curved bit lines 6 are provided to be located on the cell contacts 5. Although FIG. 3 shows some of memory cells that enable to arrange various patterns at the highest density, peripheral circuits such as a control circuit that controls operations of the memory cells and an amplifier circuit for signal reading are placed around the memory cells in the DRAM. The peripheral circuits are configured in a pattern with a lower density than that of the memory cells.

FIGS. 4 to 32 are schematic cross-sectional views showing manufacturing steps in the manufacturing method of the semiconductor device 200. FIGS. 4A to 32A show schematic cross-sectional views along a line A-A in FIG. 3, respectively, and FIGS. 4B to 32B show schematic cross-sectional views along a line B-B in FIG. 3, respectively.

Figures 4A, 4B:
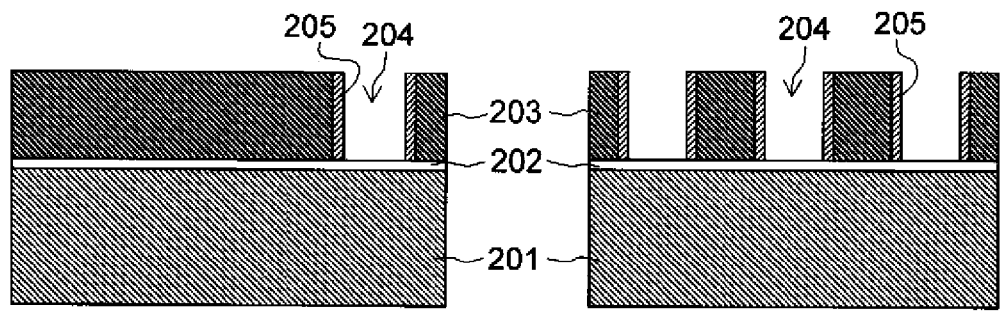

As shown in FIGS. 4A and 4B, a pad oxide film 202 is formed on a silicon substrate 201 and a silicon nitride film 203 is formed on the pad oxide film 202. A resist mask (not shown) is formed on the silicon nitride film 203, the silicon nitride film 203 is patterned to form openings 204, and then a silicon dioxide film 205 is formed on internal surfaces of the openings 204.

Figures 5A, 5B:
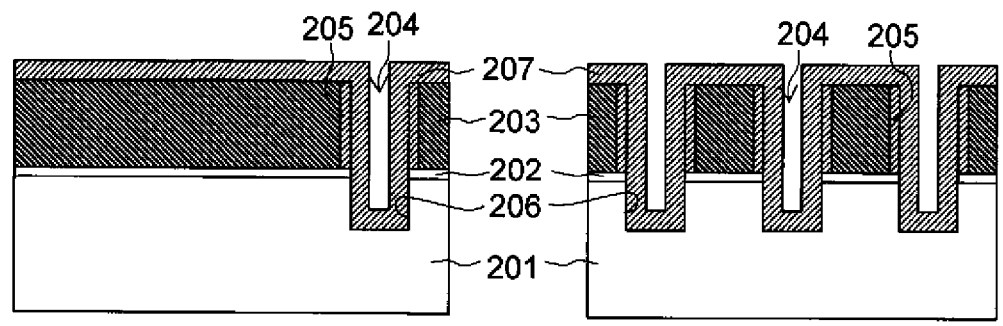
Figures 6A, 6B:
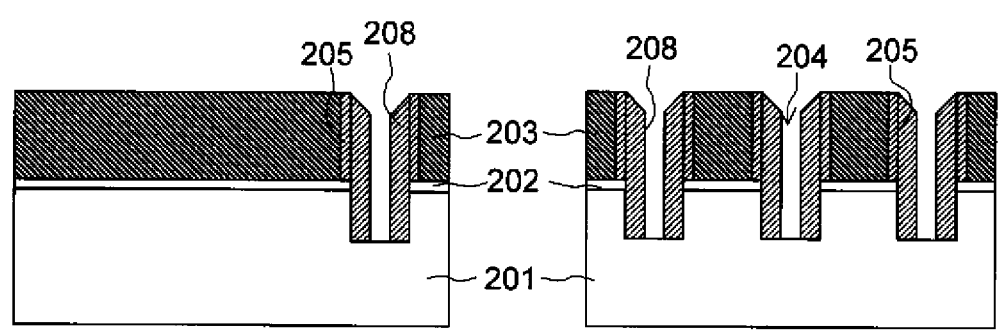

Dry etching is then performed using the silicon nitride film 203 and the silicon dioxide film 205 as a mask, thereby forming grooves 206 with a depth of 120 nanometers in the silicon substrate 201 as shown in FIGS. 5A and 5B. A silicon dioxide film 207 is then formed on inner surfaces of the openings 204 and on the silicon nitride film 203. The silicon dioxide film 207 is then etched back, thereby forming a sidewall oxide film 208 on the internal surfaces of the openings 204 as shown in FIGS. 6A and 6B.

Figures 7A, 7B:
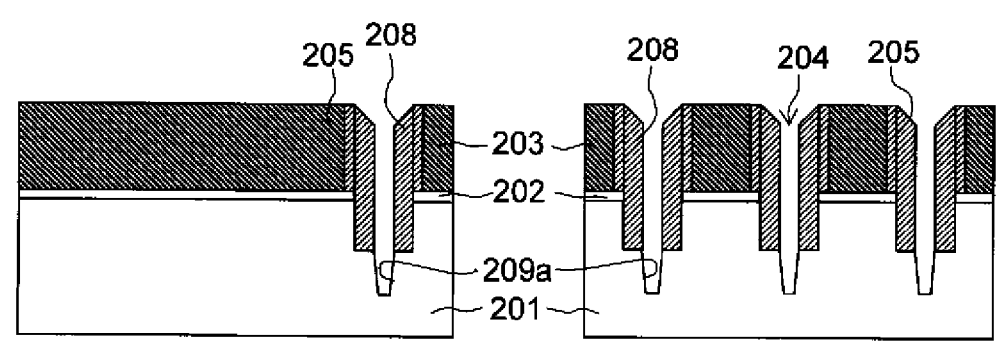
Figures 8A, 8B:
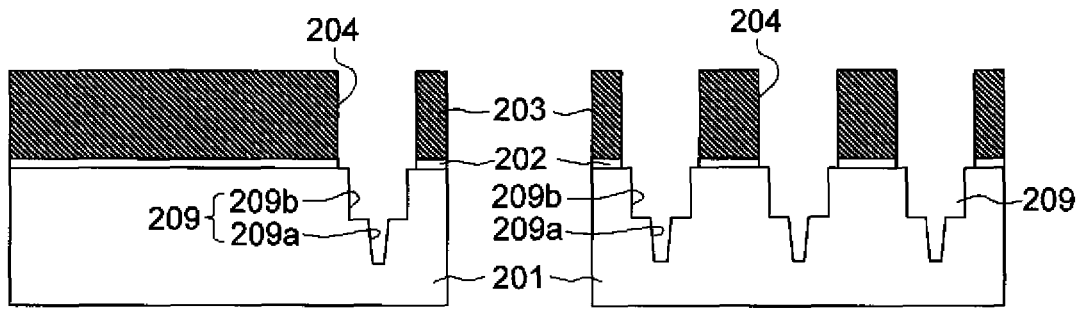

As shown in FIGS. 7A and 7B, etching is performed using the side-wall oxide film 208 as a mask to dig into the silicon substrate 201, thereby forming grooves 209a each having an opening 20 nanometers wide. The silicon dioxide films 205 and 208 are then removed, thereby forming a groove 209b above each of the grooves 209a, so that STI trenches 209 each including the grooves 209a and 209b are formed as shown in FIGS. 8A and 8B.

Figures 9A, 9B:
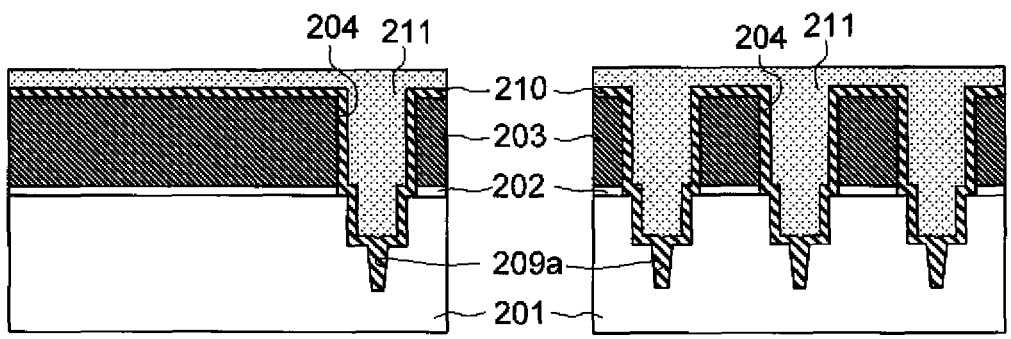

A SiON film 210 containing more O (oxygen) than N (nitrogen) in the film is then continuously formed as a liner film on inner surfaces of the trenches 209, the internal surfaces of the openings 204 in the silicon nitride film 203, and an upper surface of the silicon nitride film 203 as shown in FIGS. 9A and 9B. At that time, the grooves 209a of the trenches 209 are filled with the SiON film 210. The SiON film 210 can be formed by mixing gases of dichlorosilane ($SiH_2Cl_2$), ammonia ($NH_3$), and nitrous oxide ($N_2O$) according to an LPCVD (Low-Pressure Chemical Vapor Deposition) method, for example. A composition ratio of the SiON film 210 can be changed by changing a gas mixing ratio between $NH_3$ and $N_2O$. Accordingly, amounts of the gases are controlled so that a rate of O content in the SiON film 210 becomes higher than a rate of N content therein, thereby forming the SiON film 210 similar to an oxide film. In the present embodiment, flow rates of dichlorosilane, ammonia, and nitrous oxide are controlled to be 140 sccm, 10 sccm, and 500 sccm, respectively, a pressure of a film formation atmosphere is controlled to be 238 Pa, and a film formation temperature is controlled to be 630° C., to form the SiON film 210 with a thickness of 15 nanometers. In this example, it is desirable to inject the nitrous oxide first, then the ammonia, and the dichlorosilane last into a reaction chamber, instead of supplying these three gases at the same time. By doing so, the composition of the SiON film can be advantageously controlled easily from an initial stage of the film formation. The rate of N content in the SiON film formed in this condition is 16 atom % and the ratio in atom number of O to N is 3.0.

The rate of N content in the SiON film 210 is preferably 10 to 20 atom %, more preferably 14 to 17 atom %. The ratio in atom number of O to N is preferably 2.2 to 5.5, more preferably 2.8 to 3.5. If the rate of N content in the SiON film is smaller than 10 atom % and the ratio in atom number of O to N is larger than 5.5, the stopping power for oxidant diffusion of the SiON film is reduced, which makes difficult to prevent the silicon substrate located in a layer below the SiON film from being oxidized. Accordingly, a leak current at a junction in contact with the STI region is increased due to increased stress. If the rate of N content in the SiON film is larger than 20 atom % and the ratio in atom number of O to N is smaller than 2.2, polysilazane formed in the grooves 209b at a later step is inadequately reformed and thus it is difficult to avoid occurrence of voids.

In the present embodiment, the SiON film is 15 nanometers thick. Therefore, the grooves 209a each having the opening 20 nanometers wide can be completely buried in the SiON film, which facilitates later filling of the trenches 209 with polysilazane. The liner film for STI is not limited to a single layer of the SiON film, and a silicon dioxide film 2 to 5 nanometers thick can be formed under the SiON film to form the liner film for STI.

Figures 10A, 10B:
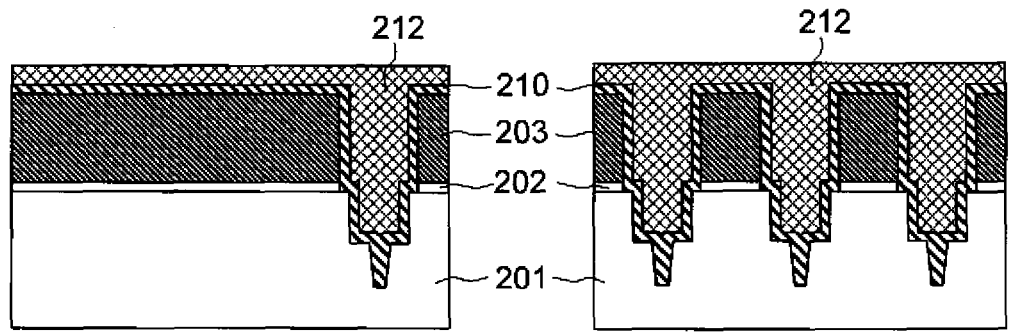

Polysilazane 211 is then spin-coated all over the substrate to fill the trenches 209 and the openings 204 with the SiON film 210 interposed therebetween. In the present embodiment, the coated film is 500 nanometers thick on a flat surface of the silicon substrate. Annealing (steaming) is then performed in a steam ($H_2O$) atmosphere, thereby reforming the polysilazane 211 into a dense silicon dioxide film 212 as shown in FIGS. 10A and 10B. The polysilazane 211 can be reformed more effectively by steaming in a stepwise manner starting from a low temperature than by one-time high-temperature steaming. For example, it is more desirable to perform steaming in a stepwise manner for 30 minutes at 400° C., 30 minutes at 500° C., 30 minutes at 600° C., and 30 minutes at 700° C., than one-time steaming for 30 minutes at 700° C. In the present embodiment, the steaming is performed at three steps, i.e., for 30 minutes at 400° C., 30 minutes at 500° C., and 30 minutes at 600° C.

Figures 11A, 11B:
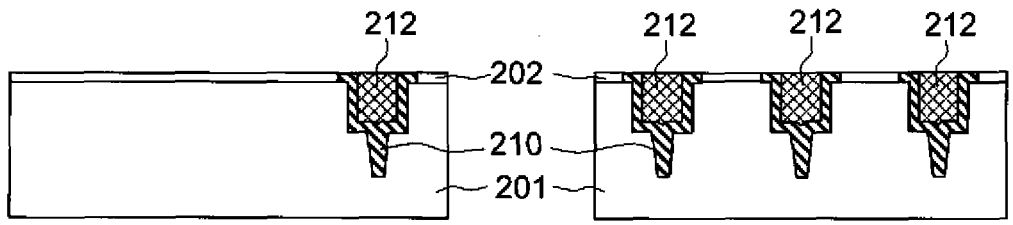

CMP (Chemical Mechanical Polishing) and wet etching of the silicon nitride film 203 is then performed, so that the silicon dioxide film 212 remains in the trenches 209 as shown in FIGS. 11A and 11B.

A silicon nitride film 213 is then formed all over the substrate as shown in FIGS. 12A and 12B, and then the silicon nitride film 213 is patterned with a photoresist (not shown) as shown in FIGS. 13A and 13B. Gate trenches 214 are then formed in the silicon substrate 201 by using the patterned silicon nitride film 213 as a mask.

The silicon nitride film 213 and the pad oxide film 202 are removed, and then thermal oxidation is performed to form a gate oxide film 215 as shown in FIGS. 14A and 14B. A doped polycrystalline silicon film (DOPOS film) 216 is filled in the gate trenches 214 with the gate oxide film 215 interposed therebetween, and the DOPOS film 216 with a thickness of 70 nanometers is formed all over the silicon substrate as shown in FIGS. 15A and 15B. A metal film (or silicide film) 217 with a thickness of 70 nanometers is formed on the DOPOS film 216. A tungsten (W) film or a tungsten silicide (WSi) film is preferably used as the metal film (or the silicide film) 217, for example. A silicon nitride film 218 with a thickness of 130 nanometers is then formed on the metal film 217.

The silicon nitride film 218, the metal film 217, and the DOPOS film 216 are patterned as shown in FIGS. 16A and 16B. In this way, gate electrodes 219 each composed of the DOPOS film 216 and the metal film 217, and a cap insulating film 220 composed of the silicon nitride film 218 are formed. Ion implantation is performed using the gate electrodes 219 and the cap insulating film 220 as a mask, thereby forming an LDD (Lightly Doped Drain) layer 221 in the silicon substrate 201.

A silicon nitride film is then formed all over the substrate and etched back, so that a side-wall insulating film 222 with a thickness of 10 nanometers is formed on side walls of laminated films each including the gate electrode 219 and the cap insulating film 220 as shown in FIGS. 17A and 17B. Consequently, narrow groove-like regions 223 are formed between adjacent gate electrodes 219.

The gate dioxide film 215 at bottoms of the groove-like regions 223 are then removed, and an epitaxial silicon layer 224 containing impurities is formed on the silicon substrate 201 as shown in FIGS. 18A and 18B. The epitaxial silicon layer 224 serves as a source or drain region. A SiON film 225 with a thickness of 10 nanometers, containing more O (oxygen) than N (nitrogen) in the film, is formed as a liner film continuously covering internal surfaces of the groove-like regions 223 and upper surfaces of the cap insulating film 220. The SiON film 225 can be formed in the same manner as that of the SiON film 210 formed at the step shown in FIGS. 9A and 9B. It is preferable that a rate of N content in the film and a ratio in atom number of O to N be the same as those of the SiON film 210.

In the present embodiment, the DOPOS film 216, the metal film 217, the silicon nitride film 218, and the SiON film 225 has a total thickness of 280 nanometers. When a minimum feature size depending on a resolution limit of lithography is 70 nanometers, a width of the gate electrode 219 and a distance between the adjacent gate electrodes 219 are both 70 nanometers. Because the side-wall insulating film 222 with the thickness of 10 nanometers is formed on the gate electrode 219 and the SiON film 225 with the thickness of 10 nanometers is further formed on the side-wall insulating film 222, each space comes to be 30 nanometers. That is, the spacing portions are 30 nanometers wide and 280 nanometers high (its aspect ratio is about nine), resulting in the groove-like regions 223 which are difficult to be filled with an insulating film formed by a common plasma CVD method with occurrence of voids being avoided. Situations will be more difficult if semiconductor elements are downsized in the future and accordingly minimum feature sizes are reduced.

Polysilazane 226 is then spin-coated all over the substrate to fill in the groove-like regions 223 with the SiON film 225 interposed therebetween as shown in FIGS. 18A and 18B. The coated film is 560 nanometers thick over the flat surface of the silicon substrate. Annealing (steaming) is then performed in a steam atmosphere, thereby reforming the polysilazane 226 into a dense silicon dioxide film 227 as shown in FIGS. 19A and 19B. To reform the polysilazane 226, steaming at three steps for 30 minutes at 400° C., 30 minutes at 500° C., and 30 minutes at 600° C. is performed. After the coating, the formed polysilazane is located up to a position about 200 nanometers higher than an upper surface of the SiON film 225 on the cap insulating film 220, and then the reforming reduces the thickness of the polysilazane by 15% for densification. As a result, the silicon dioxide film 227 is 480 nanometers thick from the surface of the silicon substrate 201, which indicates that the surface of the silicon dioxide film 227 is lowered to a position 200 nanometers higher than the upper surface of the SiON film 225 on the cap insulating film 220.

The silicon dioxide film 227 is flattened by performing the CMP using the SiON film 225 as a stopper, so that the silicon dioxide film 227 remains in the groove-like regions 223 as shown in FIGS. 20A and 20B. In this way, the silicon dioxide film 227 acting as an interlayer insulating film that fills in spaces between the adjacent gate electrodes 219 is formed.

When the silicon dioxide film obtained by reforming the polysilazane is polished by the CMP method, it is preferable that the film thickness of the coated polysilazane (film thickness from the surface of the silicon substrate) be controlled in consideration of thickness decrease during the reforming so that an surface of the silicon dioxide film is located 170 to 230 nanometers higher than a top surface of an underlying topmost layer. If the silicon dioxide film is thinner than 170 nanometers, flat continuity between the memory cell regions and the peripheral circuit regions cannot be maintained. If the silicon dioxide film is thicker than 230 nanometers, polishing fluctuation caused by the CMP method is reflected in the plane of the silicon substrate, which adversely affects lithography at a later step.

Cell contact holes 228 are then formed to expose an upper surface of the epitaxial silicon layer 224 as shown in FIGS. 21A and 21B. A DOPOS film 229 is then formed all over the substrate including insides of the cell contact holes 228 as shown in FIGS. 22A and 22B. The CMP is then performed to flatten the DOPOS film 229 and leave the DOPOS film 229 in the cell contact holes 228, thereby forming cell contacts 230 as shown in FIGS. 23A and 23B.

A silicon dioxide film 232 having openings 231 to expose the cell contacts 230 (corresponding to the cell contacts denoted by reference numeral 5 in FIG. 3) that electrically connects bit lines (corresponding to the bit lines denoted by 6 in FIG. 3) is formed as shown in FIGS. 24A and 24B. A high-melting-point metal silicide film 233 (for example, cobalt silicide) is then formed on the cell contacts 230 exposed in the openings 231.

Bit contacts 234 are then formed to fill the openings 231 as shown in FIGS. 25A and 25B. A laminated layer film having a tungsten (W) film formed on a titanium nitride (TiN) film can be suitably used as the bit contact.

A metal film 235 for bit lines that connects the bit contacts 234 is formed as shown in FIGS. 26A and 26B. The metal film 235 includes a 50-nanometer-thick W film formed on a 10-nanometer-thick tungsten nitride (WN) film. A silicon nitride film 236 with a thickness of 210 nanometers is formed thereon. The silicon nitride film 236 and the metal film 235 are then patterned as shown in FIGS. 27A and 27B. In this way, bit lines 237 each composed of the metal film 235 and a cap insulating film 238 composed of the silicon nitride film 236 are formed. In the present embodiment, during the patterning, widths of the bit lines 237 and the cap insulating film 238 are formed into 30 nanometers by using a thinning technique of the lithography.

A silicon nitride film is then formed all over the substrate and etched back, thereby forming a side-wall insulating film 239 with a width of 30 nanometers on side walls of a laminated layer film including the bit line 237 and the cap insulating film 238 as shown in FIGS. 27A and 27B. In this way, narrow groove-like regions 240 are formed between adjacent bit lines 237.

A SiON film 241 containing more O (oxygen) than N (nitrogen) in the film with a thickness of 10 nanometers is formed as a liner film that continuously covers inner surfaces of the groove-like regions 240 and an upper surface of the cap insulating film 238 as shown in FIGS. 28A and 28B. The SiON film 241 can be formed in the same manner as that of the SiON films 210 and 225 formed at steps described with reference to FIGS. 9A, 9B, 18A and 18B. It is preferable that a rate of N content and a ratio in atom number of O to N in the film also be the same as those in the SiON films 210 and 225.

The bit line 237, the cap insulating film 238, and the SiON film 241 has a total thickness of 280 nanometers. When a pitch of the bit lines 237 is 140 nanometers, each spacing is 30 nanometers wide when considering that the bit lines 237 is 30 nanometers wide, the side-wall insulating film 239 is 30 nanometers wide, and the SiON film 241 is 10 nanometers thick. That is, the spacing portions are 30 nanometers wide and 280 nanometers high (its aspect ratio is about nine), resulting in the groove-like regions 240 which are difficult to be filled with an insulating film formed by the common plasma CVD method with occurrence of voids being avoided. Situations will be more difficult if the semiconductor elements are downsized in the future and the minimum feature sizes are reduced.

Figure 29A:
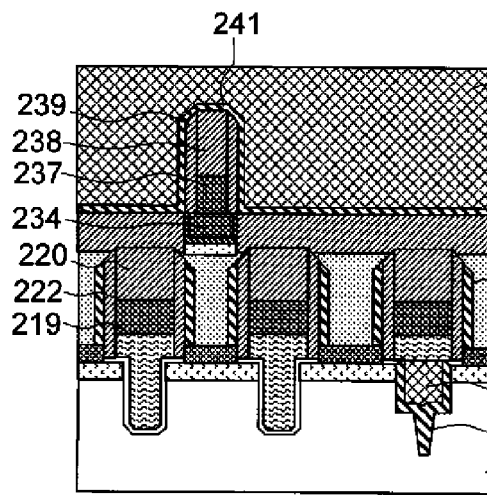
Figure 29B:
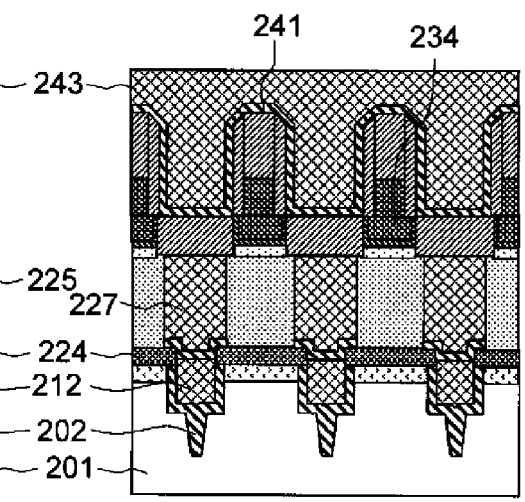

Polysilazane 242 with a thickness of 560 nanometers is then spin-coated all over the substrate to fill the groove-like regions 240 with the SiON film 241 interposed therebetween as shown in FIGS. 28A and 28B. Annealing (steaming) is then performed in a steam atmosphere, thereby reforming the polysilazane 242 into a dense silicon dioxide film 243 as shown in FIGS. 29A and 29B. For the reforming, steaming at three steps, i.e., for 30 minutes at 400° C., 30 minutes at 500° C., and 30 minutes at 600° C. is performed. After the coating, the formed polysilazane is located up to a position about 280 nanometers higher than an upper surface of the SiON film 241 on the cap insulating film 238, and the reforming reduces the thickness of the polysilazane by 15% for densification. As a result, the thickness of the silicon dioxide film 243 is 480 nanometers from the surface of the SiON film 241 on the silicon dioxide film 232, and the thickness of the silicon dioxide film 243 is 200 nanometers from the surface of the SiON film 241 on the cap insulating film 238.

Figure 30A:
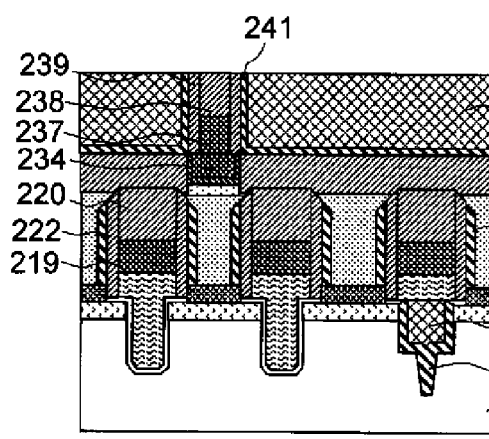
Figure 30B:
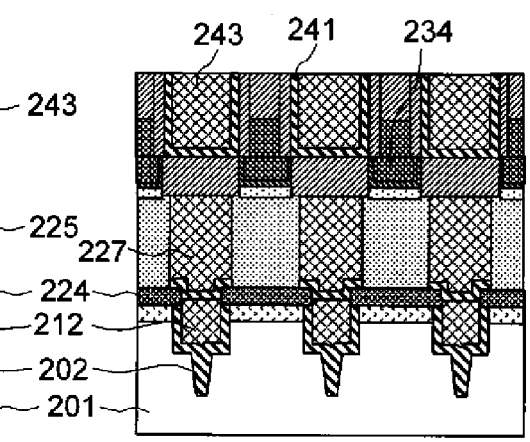

The silicon dioxide film 243 is then flattened by the CMP until upper surfaces of the cap insulating film 238 and the side-wall insulating film 239 are exposed so that the silicon dioxide film 243 is left in the groove-like regions 240 as shown in FIGS. 30A and 30B. In this way, the silicon dioxide film 243 acting as an interlayer insulating film filled in spaces between the bit lines 237 is formed. When the silicon dioxide film obtained by reforming the polysilazane is polished by the CMP method, it is preferable that the film thickness of the coated polysilazane (film thickness from the surface of the silicon substrate) be controlled in consideration of thickness decrease during the reforming so that the surface of the silicon dioxide film is located 170 to 230 nanometers higher than a top surface of a topmost one of underlying layers. If the silicon dioxide film is thinner than 170 nanometers, the flat continuity between the memory cell regions and the peripheral circuit regions cannot be maintained. If the silicon dioxide film is thicker than 230 nanometers, the polishing fluctuation caused by the CMP method is reflected in the plane of the silicon substrate, which adversely affects the lithography at a later step.

Figures 31A, 31B:
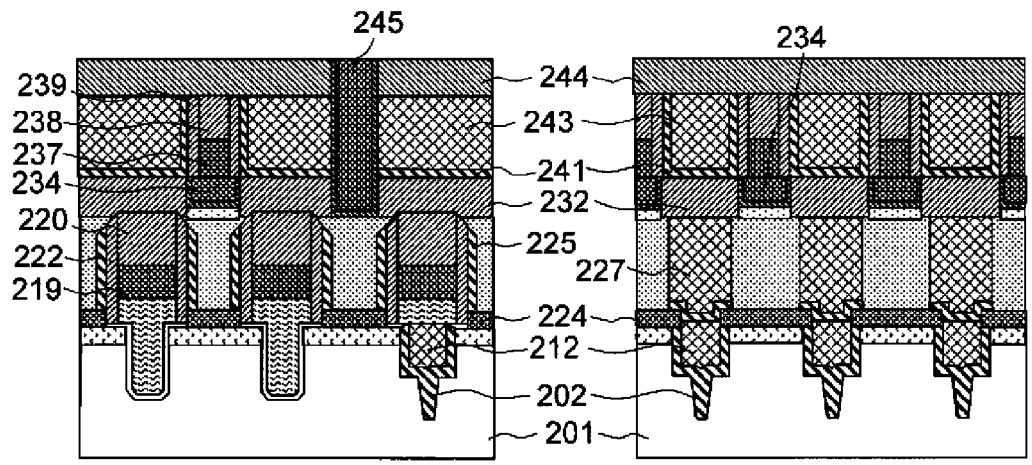

A silicon nitride film 244 is then formed all over the substrate, through-holes penetrating through the silicon dioxide film 244, the silicon dioxide film 242, the SiON film 241, and the silicon dioxide film 232 are then formed, and capacitance contacts 245 are formed to fill the through-holes as shown in FIGS. 31A and 31B. A laminated layer film including a tungsten (W) film formed on a titanium nitride (TiN) film can be suitably used as the capacitance contact, for example. When contact resistance between the capacitance contacts 245 and the cell contacts 230 needs to be reduced in this example, a metal silicide such as cobalt silicide can be provided therebetween.

Figures 32A, 32B:
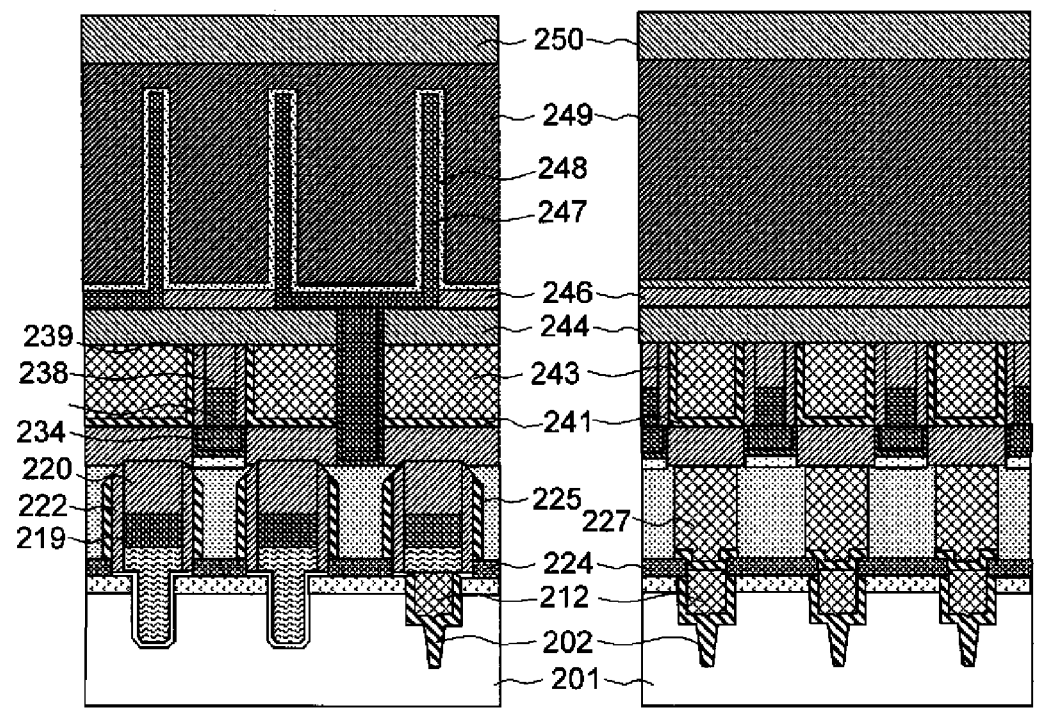

A lower electrode 247 of each capacitor is formed to connect each of the capacitance contacts 245 in an opening formed in an interlayer insulating film 246 as shown in FIGS. 32A and 32B. A capacitance insulating film 248 and a plate electrode 249 are formed thereon, and an interlayer insulating film 250 is formed last. In this way, memory cells of a DRAM are completed.

As described above, according to the present embodiment, the SiON film containing more O than N in the film and being similar in composition to the silicon dioxide film is used as the liner film during the formation of the silicon dioxide film to fill the trenches 209 for formation of the STI regions, the groove-like regions 223 between the gate electrodes 219, and the groove-like regions 240 between the bit lines 237, respectively. Therefore, the film obtained by coating and steaming of the polysilazane to be filled in the trenches or regions can be a dense silicon dioxide film.

[First Modification]

According to the embodiment described above, in the LPCVD method using the mixed gas including dichlorosilane ($SiH_2Cl_2$), ammonia ($NH_3$), and nitrous oxide ($N_2O$), the composition ratios in the SiON films 210, 225, and 241 as the liner films are changed by changing the gas mixing ratio between $NH_3$ and $N_2O$ to form the SiON films similar to the oxide film. However, the film forming method of the SiON film is not limited thereto. A modification of the film forming method of the SiON film is explained below.

Figure 33:
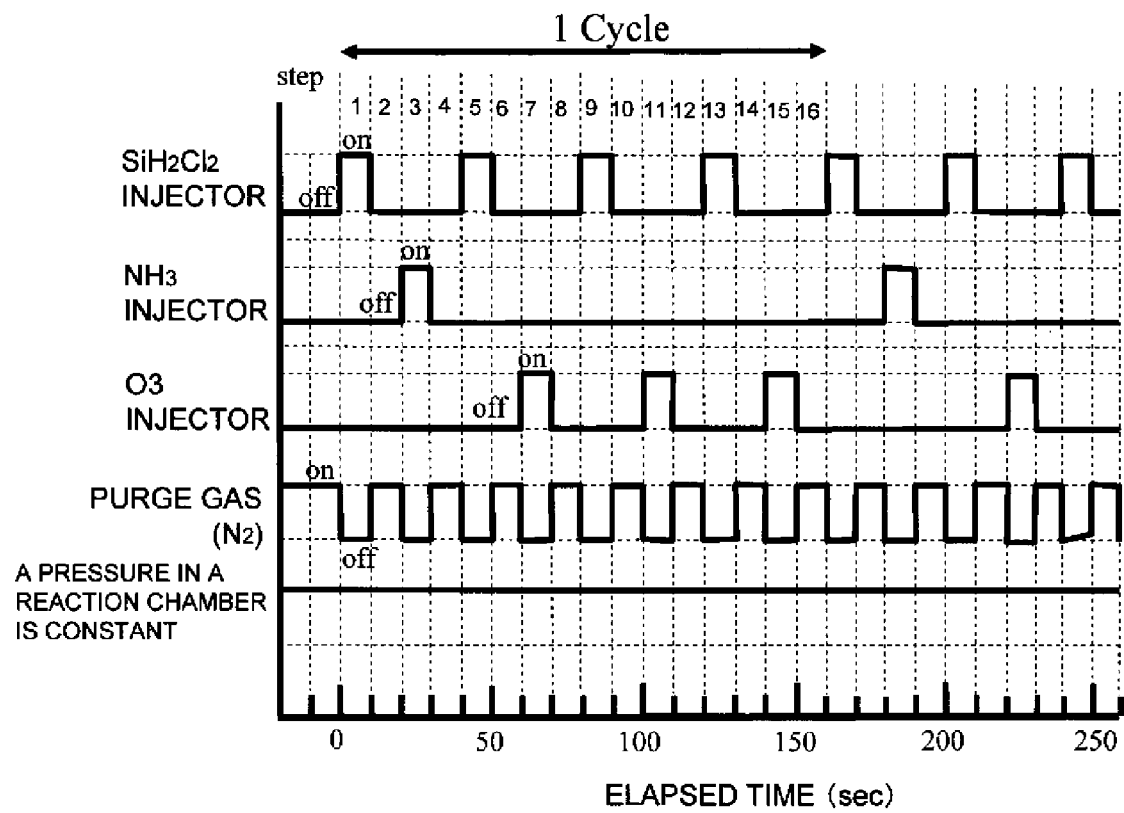
FIG. 33 is a time chart for explaining a film forming method of a SiON film according to an ALD (Atomic Layer Deposition) method.

FIG. 33 is a time chart for explaining a film forming method of a SiON film according to an ALD (Atomic Layer Deposition) method. As shown in FIG. 33, dichlorosilane ($SiH_2Cl_2$), ammonia ($NH_3$), and ozone ($O_3$) are used as film forming gases. In this modification, a pressure in a reaction chamber is constant.

The ALD method utilizes atom adsorption to a substrate, which is different from the CVD method that enables to produce $SiO_2$ or $Si_3N_4$ in a free space in a gas phase and deposit $SiO_2$ or $Si_3N_4$ on a substrate. Therefore, adsorptive film formation is basically performed for each of atomic layers of Si, O, and N. Accordingly, composition of a film finally formed can be advantageously controlled by the number of steps of supplying each atom.

The reaction chamber is first purged with $N_2$, and $SiH_2Cl_2$ is injected for 10 seconds at step 1. The reaction chamber is then purged with $N_2$ for 10 seconds at step 2. Next, $NH_3$ is injected for 10 seconds at step 3, and then the reaction chamber is purged with $N_2$ for 10 seconds at step 4. Subsequently, $SiH_2Cl_2$ is injected for 10 seconds at step 5, and then the reaction chamber is purged with $N_2$ for 10 seconds at step 6. Subsequently, $O_3$ is injected for 10 seconds at step 7, and then the reaction chamber is purged with $N_2$ for 10 seconds at step 8.

In this way, the SiON film is formed by repeatedly performing the gas injection and the purge according to the time chart. In this modification, the injection of $SiH_2Cl_2$ is performed at four steps in one cycle (16 steps), i.e., steps 1, 5, 9, and 13, the injection of $NH_3$ is performed at one step, i.e., step 3, and the injection of $O_3$ is performed at three steps, i.e., steps 7, 11, and 15 as shown in FIG. 33. Accordingly, the formed SiON film has a composition ratio of Si:O:N=4:3:1. As a result, a rate of N content in the SiON film is in a range of 12 to 13 atom % and a ratio in atom number of O to N can be controlled to be 3.

As described above, when the ALD method is applied, the content rates of Si, O, and N in the SiON film can be controlled more precisely than in the LPCVD method. Therefore, the rate of N content in the SiON film falls into the range of 12 to 13 atom % and the ratio in atom number of O to N can be reliably controlled to be 3.

[Second Modification]

Figure 34:
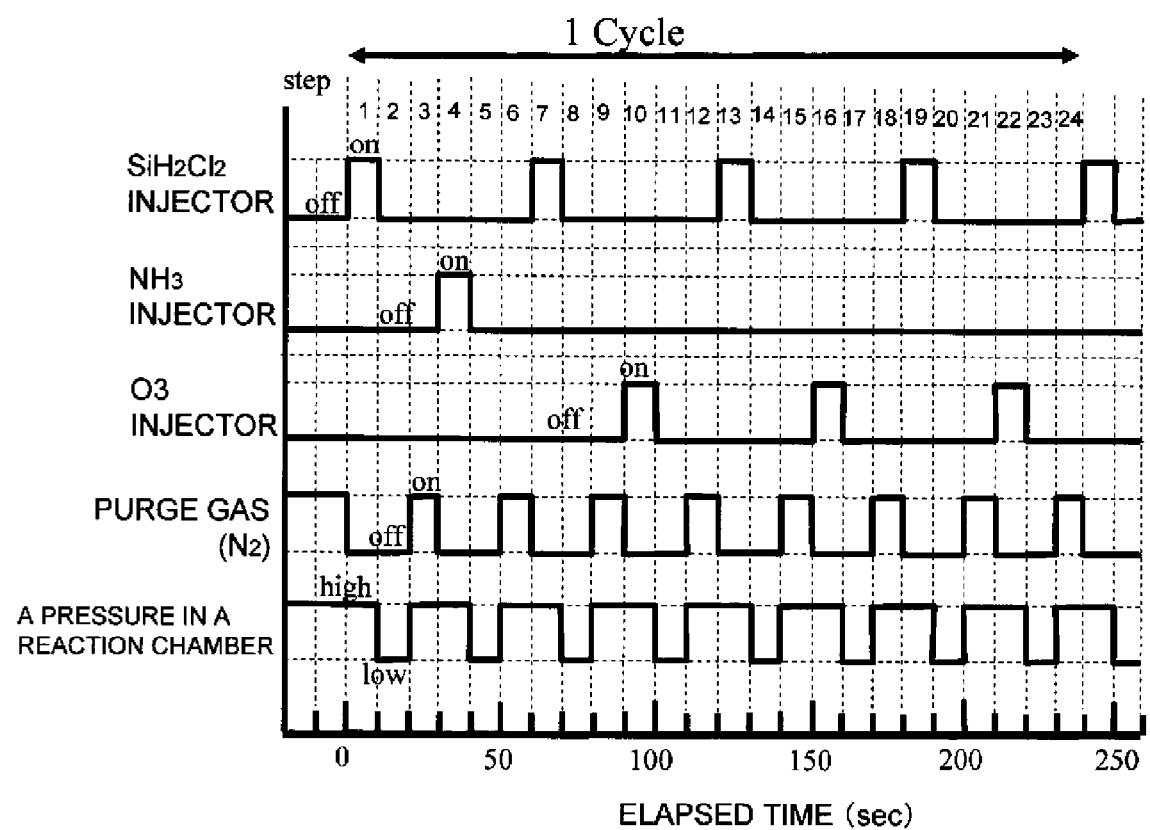
FIG. 34 is a time chart for explaining another modification of the film forming method of the SiON film by the ALD method.

FIG. 34 is a time chart for explaining another modification of the film forming method of the SiON film by the ALD method. As shown in FIG. 34, this modification is different from the method shown in FIG. 33 in that a step of vacuuming a reaction chamber is added between each of steps of injecting a film forming gas and each of $N_2$ purging steps.

According to the film forming method shown in FIG. 34, while film formation time is longer than that in the modification shown in FIG. 33, content rates of Si, O, and N in a SiON film can be more precisely controlled.

[Third Modification]

In the embodiment described above, the example in which the coating and steaming of the polysilazane are each performed once to form the silicon dioxide film in the narrow groove-like regions has been described. A method of forming a silicon dioxide film in groove-like regions by using the polysilazane at two steps is explained here.

FIGS. 35A to 35D and 36A to 36C are schematic cross-sectional views for explaining modifications of a forming method of a silicon dioxide film by using the polysilazane in STI trenches and groove-like regions between gate electrodes, respectively.

A modification of the forming method of a silicon dioxide film in the STI trenches is explained with reference to FIGS. 35A to 35D. This modification is particularly applied suitably to cases where trenches have greater widths.

Figure 35A:
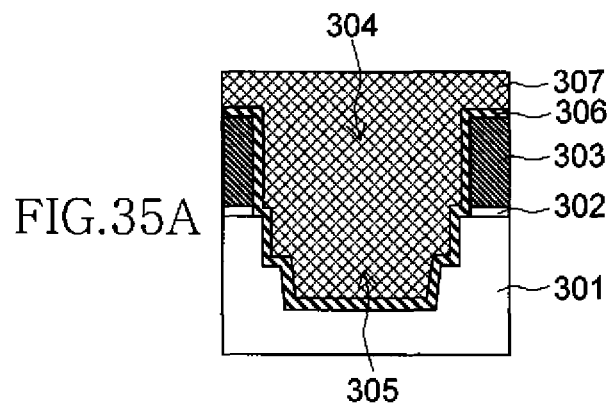
FIGS. 35A to 35D and 36A to 36D are schematic cross-sectional views for explaining modifications of a forming method of a silicon dioxide film by using the polysilazane in STI trenches and groove-like regions between gate electrodes, respectively.

As shown in FIG. 35A, a pad oxide film 302 and a silicon substrate 301 are etched by using a silicon nitride film 303 having openings 304, thereby forming STI trenches 305 in the silicon substrate 301. A SiON film 306 being similar in composition to a silicon dioxide film is then formed as a liner film continuously on inner surfaces of the openings 304 and in the trenches 305. Polysilazane is coated with the SiON film 306 interposed, and then annealing (first annealing) in a steam atmosphere is performed to reform the polysilazane, thereby forming a dense silicon dioxide film 307.

Figure 35B:
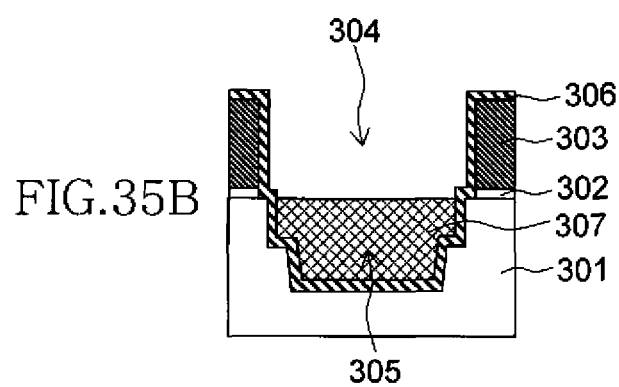

The silicon dioxide film 307 is then etched back to remove the silicon dioxide film 307 in the openings 304 and leave the dense silicon dioxide film 307 in the trenches 305 as shown in FIG. 35B.

Figure 35C:
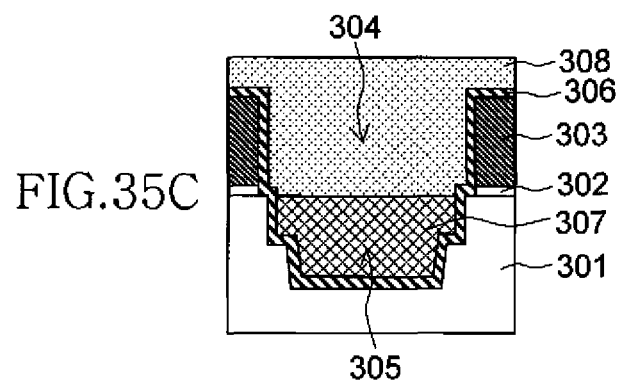
Figure 35D:
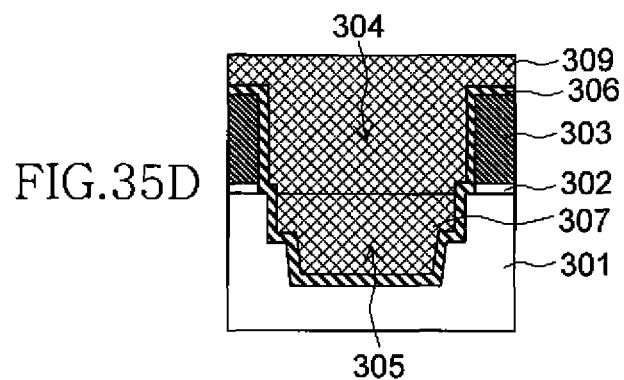

As shown in FIG. 35C, polysilazane 308 is coated thereon to fill in the openings 304 and then steaming (second annealing) is performed, thereby forming a dense silicon dioxide film 309 as shown in FIG. 35D.

When the annealing for coating and reforming the polysilazane is thus performed in twice, the polysilazane can be adequately reformed from bottoms of the trenches 305 to upper surfaces of the openings 304.

A modification of a forming method of a silicon dioxide film in the groove-like regions between the gate electrodes is explained with reference to FIGS. 36A to 36D. FIGS. 36A to 36D show steps that can be replaced with the steps shown in FIGS. 18A, 18B, 19A and 19B in the above embodiment. Therefore, in FIGS. 36A to 36D, constituent elements identical to those in the above embodiment are denoted by like reference numerals and explanations thereof will be omitted.

Figure 36A:
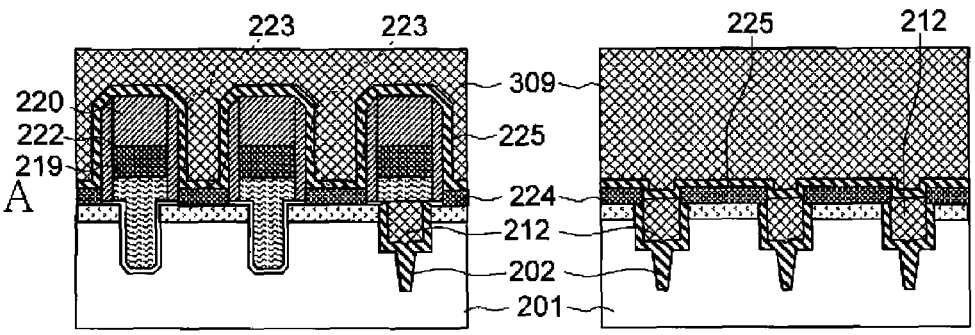

As shown in FIG. 36A, the SiON film 225 being similar in composition to a silicon dioxide film is formed as a liner film that continuously covers the inner surfaces of the groove-like regions 223 and the upper surface of the cap insulating film 220. Polysilazane is then coated all over the substrate to fill in the groove-like regions 223 with the SiON film 225 interposed therebetween and then annealing (first annealing) is performed in a steam atmosphere to reform the polysilazane, thereby forming the dense silicon dioxide film 309.

Figure 36B:
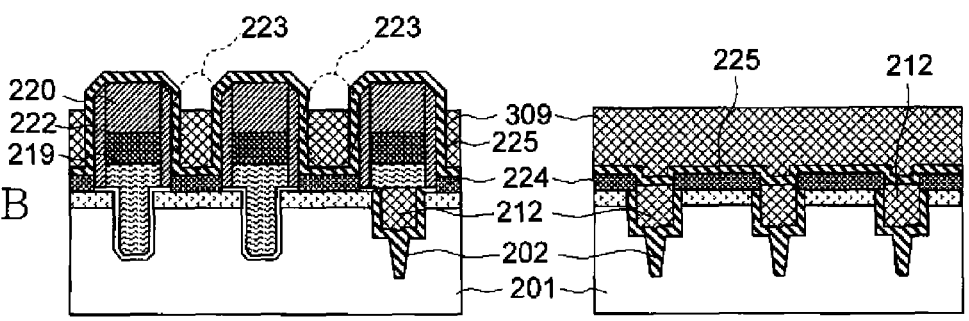

The silicon dioxide film 309 is then etched back to dig the silicon dioxide film 309 to a depth corresponding to about half the height of the cap insulating film 220 as shown in FIG. 36B.

Figure 36C:
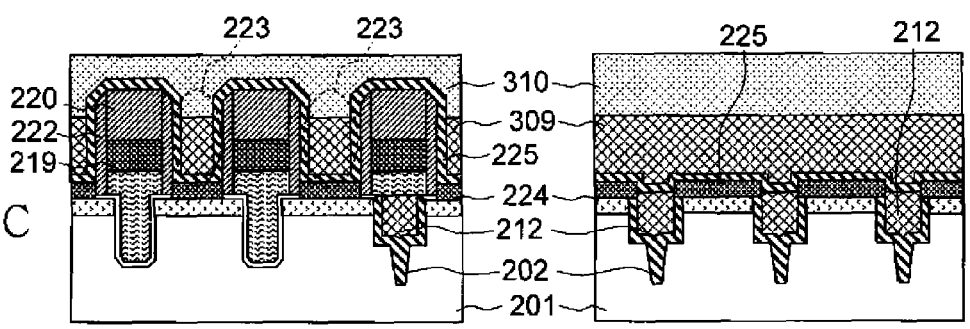
Figure 36D:
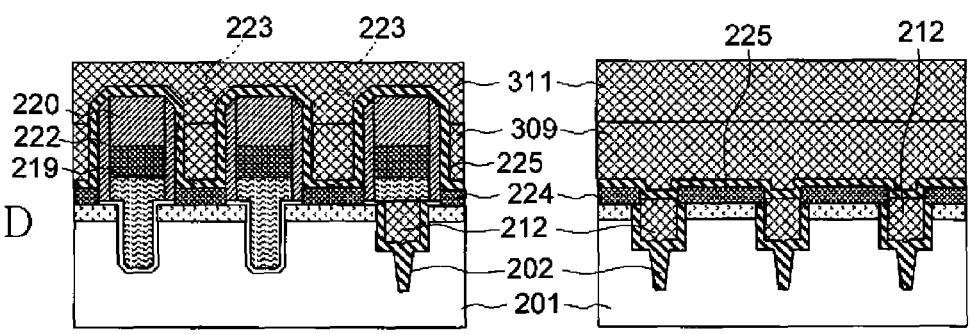

Polysilazane 310 is then coated all over the substrate including upper parts of the groove-like regions 223 and then steaming (second annealing) is performed, thereby forming a dense silicon dioxide film 311 as shown in FIG. 36C.

When the annealing for coating and reforming the polysilazane is thus performed in twice, the polysilazane can be adequately reformed from bottoms of the groove-like regions 223 to the upper parts thereof more effectively.

[Fourth Modification]

A modification in which the present invention is applied to formation of an interlayer insulating film between silicon pillars in a memory cell transistor, the silicon pillars being formed on a silicon substrate to be used as channel regions, is explained below.

Figure 37:
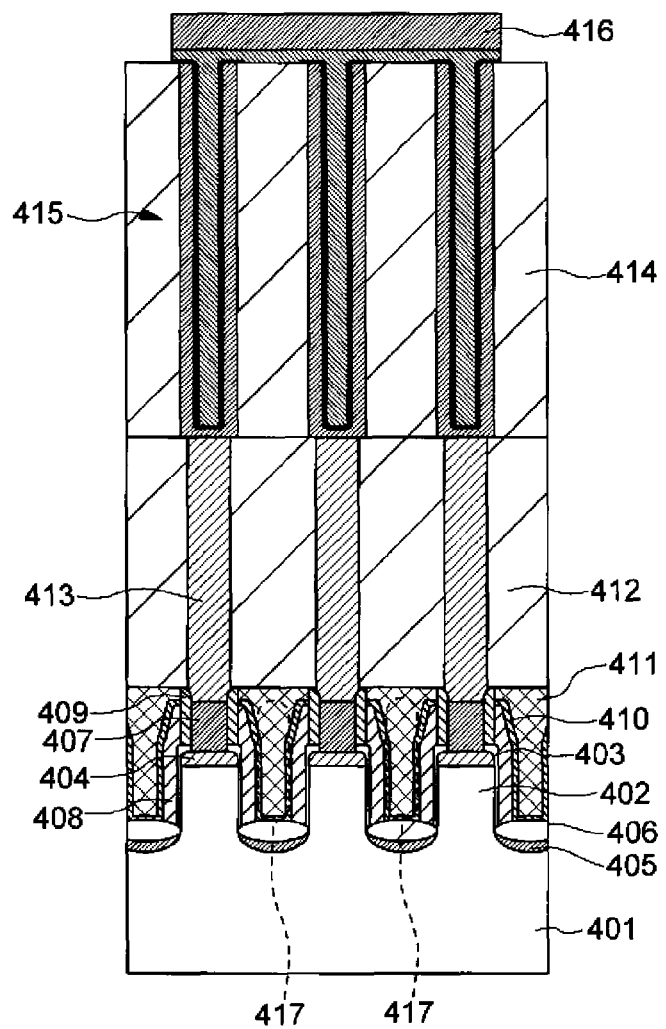
FIG. 37 is a schematic cross-sectional view for explaining a structure of a semiconductor device 400 according to a fourth modification.

FIG. 37 is a schematic cross-sectional view for explaining a structure of a semiconductor device 400 according to the modification.

As shown in FIG. 37, the semiconductor device 400 has a plurality of silicon pillars 402 in a silicon substrate 401. Each of the silicon pillars 402 has side surfaces covered with a gate insulating film 403. An LDD layer 404 is formed at upper parts of the silicon pillars 402, and a first diffusion layer 405 is formed between lower parts of adjacent silicon pillars 402. An upper surface of each piece of the first diffusion layer 405 is covered with a silicon dioxide film 406. A second diffusion layer 407 is formed on the LDD layer 404, and gate electrodes 408 are formed on the side surfaces of the second diffusion layer 407 and the side surfaces of the silicon pillars 402 with a side-wall insulating film 409 and the gate insulating film 403 interposed therebetween.

A SiON film 410 containing more O than N is formed according to the present invention to continuously cover inner surfaces of narrow groove-like regions 417 between adjacent gate electrodes 408 each covering the side surfaces of adjacent silicon pillars 402. Polysilazane is coated in the groove-like regions 417 between the gate electrodes 408 with the SiON film 410 interposed therebetween and then steaming is performed, thereby forming a silicon dioxide film 411 reformed into a dense film as an interlayer insulating film.

Capacitance contacts 413 that connect the second diffusion layer 407 are formed in an interlayer insulating film 412 which is formed on the silicon dioxide film 411. Capacitors 415 each having a lower electrode connected to each capacitance contact 413 are formed in an interlayer insulating film 414 which is formed on the interlayer insulating film 412. Bit lines 416 are formed on the interlayer insulating film 414 to connect upper electrodes of the capacitors 415.

In this way, also in the semiconductor device including the silicon pillars, the silicon dioxide film having a satisfactory film quality can be formed by applying the present invention to formation of the interlayer insulating film in the narrow groove-like regions 417 between the silicon pillars. Also in the present modification, the annealing for coating and reforming the polysilazane can be performed in twice. This enables the polysilazane from bottoms to upper parts of the groove-like regions 417 to be adequately reformed more effectively.

[Fifth Modification]

A modification in which the present invention is applied to a multilayer interconnection structure formed on a silicon substrate of a logic semiconductor device is explained below.

Figure 38:
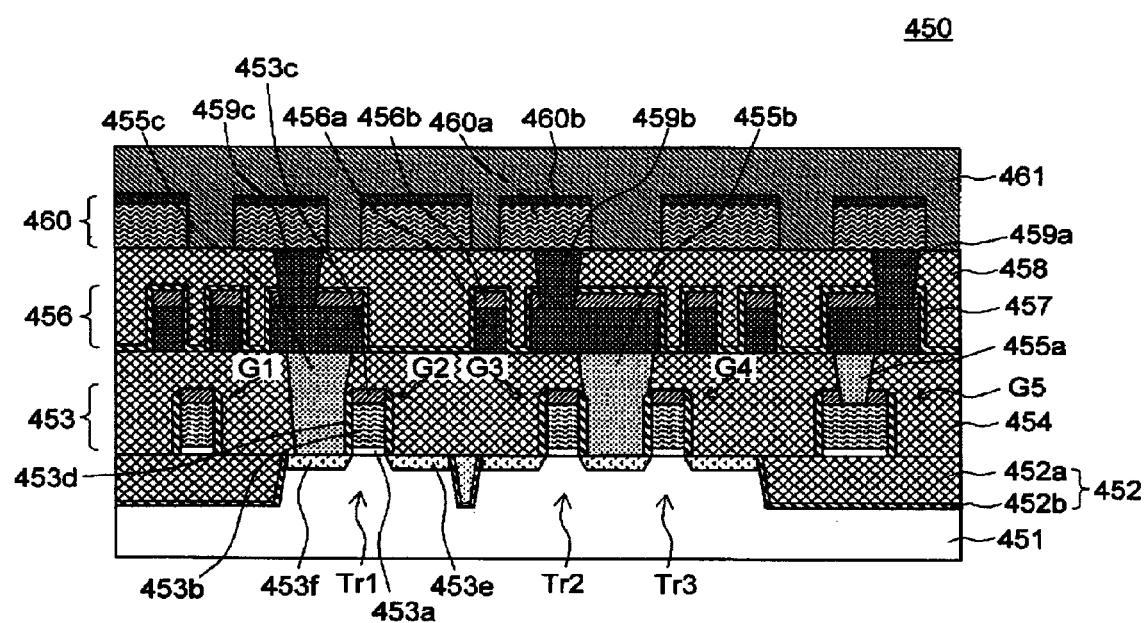
FIG. 38 is a schematic cross-sectional view for explaining a structure of a semiconductor device 450 according to the fifth modification.
Figure 39:
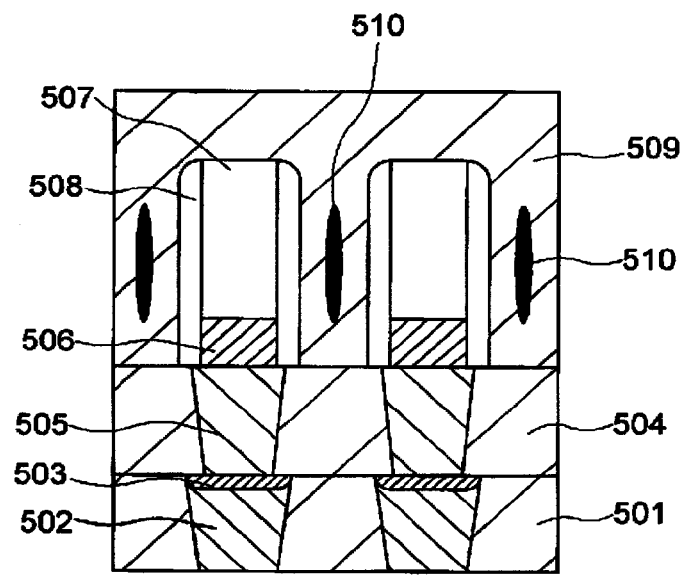
FIG. 39 is a schematic cross-sectional view showing an example in which a silicon dioxide film is formed between bit lines by the HDP-CVD method.
Figure 40:
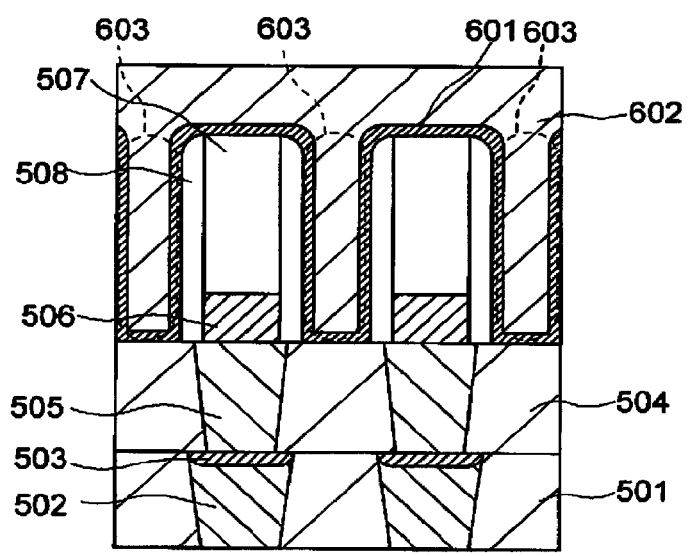
FIG. 40 shows an example in which a silicon nitride film is used as an oxidation-resistant liner film and a silicon dioxide film is made of polysilazane.

FIG. 38 is a schematic cross-sectional view for explaining a structure of a semiconductor device 450 according to the fifth modification.

As shown in FIG. 38, the semiconductor device 450 includes STI regions 452 formed in a silicon substrate 451, a first interconnection layer 453 including a plurality of interconnections G1, G2, G3, G4, and G5 also serving as gate electrodes of transistors formed on a surface of the silicon substrate 451, a second interconnection layer 456 located on a first interlayer insulating film 454 that is formed to cover the first interconnection layer 453, and a third interconnection layer 460 located on a second interlayer dielectric layer 458 that is formed to cover the second interconnection layer 456. In the fifth modification, SiON films containing more O than N are formed according to the present invention as underlying films of the STI region 452, the first interlayer insulating film 454, and the second interlayer insulating film 458, respectively. Although the example including the three interconnection layers is shown for convenience of explanation, more interconnection layers can be included.

The STI region 452 includes a SiON film 452b, and a silicon dioxide film 452a that is obtained by annealing the polysilazane in a steam atmosphere in the same manner as in the embodiment described above. The interconnections G1 and G5 on the STI regions 452, and the interconnections G2, G3, and G4 on active regions are formed on the surface of the silicon substrate 451. The interconnections G2, G3, and G4 on the active regions constitute gate electrodes of transistors Tr1, Tr2, and Tr3, respectively. For example, the interconnection G2 is configured by depositing a gate electrode 453b made of a high-melting-point material such as tungsten and an insulating film 453c, on a gate insulating film 453a formed on the surface of the silicon substrate 451. Diffusion layers 453e and 453f serving as a source and a drain, respectively, are formed on both sides of the interconnection G2, thereby configuring the transistor Tr1. A side wall 453d is formed on a side wall of the interconnection G2 having a SiON film containing more O than N exposed at least on a surface thereof. The first interlayer insulating film 454 including a silicon dioxide that is obtained by annealing the polysilazane in a steam atmosphere is formed to cover the first interconnection layers G1 to G5. Contact plugs 455a each connected to the gate electrodes, and contact plugs 455b and 455c connected to the diffusion layers 453e and 453f, respectively, are formed in the first interlayer insulating film 454. The contact plug 455b is shared by the transistors Tr2 and Tr3. The second interconnection layer film 456 connected to the contact plugs 455a, 455b, and 455c is formed on the first interlayer insulating film 454. The second interconnection layer 456 is formed by depositing an interconnection 456a made of a high-melting-point material and an insulting film 456b. The second interconnection layer 456 is covered by a SiON film 457 containing more O than N, and the second interlayer insulating film 458 made of a silicon dioxide film that is obtained by annealing the polysilazane in a steam atmosphere is formed on the SiON film 457. Contact plugs 459a, 459b, and 459c are formed in the second interlayer insulating film 458. The third interconnection layer 460 connected to the contact plugs 459a, 459b, and 459c is formed on the second interlayer insulating film 458. The third interconnection layer 460 is formed by depositing an interconnection 460a made of a low-melting-point material such as aluminum and a titanium nitride 460b. A laminated film 461 including a silicon nitride film or a polyimide film formed by the plasma CVD method that enables low-temperature film formation is formed as a passivation film on the third interconnection layer 460.

As described in the fifth modification, the SiON film containing more O than N and the silicon dioxide film obtained by annealing in a steam atmosphere the polysilazane coated on the SiON film can be used as the interlayer insulating film on the interconnection that is made of a material having a melting point equal to or higher than 900° C., such as tungsten, titanium nitride, or silicon, can be used for the multilayer interconnection structure.

[Sixth Modification]

In a sixth modification, a method of forming an interlayer insulating film further including a step of processing an entire surface with oxygen plasma after the SiON film containing more O than N is formed and before the polysilazane is coated is explained.

In the above embodiment, the example in which the present invention is applied to the formation of the filled STI region, the formation of the interlayer insulating film filled between the gate electrodes (also serving as the word lines), and the formation of the interlayer insulating film filled between the bit lines in a DRAM is explained. In the embodiment, the aspect ratio in the grooves between the gate electrodes or the bit lines before coating the polysilazane is about nine. The present inventors carried out a further study and checked conditions of voids produced within grooves in a structure having an aspect ratio of 10 or higher, that is, the lines are 280 nanometers high and the grooves are 25 nanometers wide before formation of the polysilazane (the aspect ratio is 11). A result of the study showed that when a cleaning step such as washing with water is inserted after formation of the SiON film containing more O than N and before coating of the polysilazane, a void production ratio is considerably increased. This phenomenon notably occurs when the aspect ratio exceeds 10. The cause thereof is thought that water cannot be completely eliminated from grooves having a high aspect ratio, and water remaining therein reacts with the polysilazane because the polysilazane reacts readily with water, which reduces coating efficiency for the polysilazane in the grooves.

To eliminate the remaining water from the grooves, tests for (1) thermal dehydration at 150° C., (2) UV (ultra violate)-ray irradiation, and (3) oxygen plasma processing were performed after the SiON film is formed. As a result, the thermal dehydration (1) was ineffective, and many voids were produced. It is supposed that the water is completed eliminated at 150° C.; however, a satisfactory effect was not achieved in practice. This implies that other factors contributing to the production of the voids remain also after elimination of the water. Some decrease in the production of the voids was confirmed in the UV irradiation (2). However, there were many fluctuations in the decrease and the production of the voids could not be completely avoided. It is thought that sufficient rays do not reach down into the grooves due to the high aspect ratio, light scattering at uneven portions on the surface, and the like.

Meanwhile, in the oxygen plasma processing (3), it was found that particularly when the processing is performed for 30 minutes in a condition that a substrate temperature is kept in a range of 200 to 300° C., typically at 250° C., the production of the voids can be avoided. At that time, a pressure is set in a range of 0.1 to 10 Torr, typically at 4 Torr. A high frequency power is 4.5 kilowatt and an oxygen-supply flow rate is 13000 sccm. The oxygen plasma ($O_2$) efficiently generates oxygen atomic radicals (O radicals) that diffuse fast and have high reactivity. It is thought that this eliminates the remaining water and the factors contributing to the void production.

Therefore, the present invention has one aspect of including a cleaning step including washing with water, and a step of performing oxygen plasma processing following the cleaning step, after the step of forming the SiON film containing more O than N on an underlying structure and before the step of coating the polysilazane. After the oxygen plasma processing is performed, an interlayer insulating film including a silicon dioxide film by coating the polysilazane and annealing the polysilazane in a steam atmosphere for reforming is formed, like in the embodiment described above. At this time, the aspect ratio in a space between lines after the SiON film is formed on the underlying structure is in a range of 10 to 15. When the aspect ratio is equal to or lower than 10, no void is produced without the oxygen plasma processing. When the aspect ratio is equal to or higher than 15, processing and manufacturing of the underlying structure itself is difficult. A heating temperature for the semiconductor substrate in the oxygen plasma processing is in a range of 200 to 300° C., preferably 240 to 260° C. The effect of avoiding the voids is insufficient when the heating temperature is equal to or lower than 200° C., and a processing device therefore has a complicated configuration and is costly when the heating temperature is equal to or higher than 300° C. The pressure in the oxygen plasma processing is preferably in a range of 0.1 to 10 Torr. The oxygen plasma processing can be performed after formation of the SiON film regardless of whether the cleaning step is provided.

Although the effect can be achieved when the oxygen plasma processing is performed using isotropic oxygen radicals not depending on an electric field, processing using anisotropic oxygen ions depending on an electric field is more preferably combined. When the oxygen ions are used, the effect of the oxygen plasma processing with respect to the bottoms of the grooves can be enhanced more even when the aspect ratio is increased. The oxygen plasma includes oxygen atoms and molecules in radical states (excited states in which the atoms and molecules do not become ions), oxygen atoms and molecules in ion states, and electrons. Therefore, when a bias is applied at a stage when the semiconductor substrate is mounted, the ions are provided with anisotropy by the electric field to be introduced into the groove bottoms. The processing using the oxygen radicals can be combined for the entire processing time, or a substrate bias can be intermittently applied. In the sixth modification, the oxygen plasma processing is essential, and UV irradiation can be performed in addition to the oxygen plasma processing.

It is apparent that the present invention is not limited to the above embodiments, but may be modified and changed without departing from the scope and spirit of the invention.

For example, in the above embodiment, a film such as a more oxidation-resistant silicon nitride film can be formed on the inner surfaces of the trenches or the groove-like regions as a layer underlying the SiON film.

What is claimed is:

1. A manufacturing method of a semiconductor device comprising:
    forming groove-like regions on each side of adjacent vertical elements;
    forming a continuous SiON film that contains more O (oxygen) than N (nitrogen) to continuously cover inner surfaces of the groove-like regions and uppermost surfaces of the adjacent vertical elements extending between adjacent groove-like regions;
    filling the groove-like regions with polysilazane with the SiON film interposed therebetween with the polysilazane covering an upper surface of the continuous SiON film covering the uppermost surfaces of the adjacent vertical elements extending between the adjacent groove-like regions; and
    forming an insulating film by reforming the polysilazane by heat treatment,
    wherein the adjacent vertical elements are adjacent bit lines, and the groove-like regions are regions between the adjacent bit lines.

2. The manufacturing method of a semiconductor device as claimed in claim 1, wherein a content rate of the N in the SiON film is 10 to 20 atom %.

3. The manufacturing method of a semiconductor device as claimed in claim 1, wherein a ratio in atom number of the O to the N in the SiON film is 2.2 to 5.5.

4. The manufacturing method of a semiconductor device as claimed in claim 1, wherein the SiON film is formed by an ALD (Atomic Layer Deposition) method.

5. The manufacturing method of a semiconductor device as claimed in claim 4, wherein Si corresponding to a four-atomic layer, O corresponding to a three-atomic layer, and N corresponding to a one-atomic layer are deposited in one cycle by the ALD method.

6. The manufacturing method of a semiconductor device as claimed in claim 1, further comprising performing oxygen plasma processing after forming the SiON film and before filling the groove-like regions.

7. The manufacturing method of a semiconductor device as claimed in claim 6, further comprising cleaning with water after forming the SiON film and before performing the oxygen plasma processing.

8. The manufacturing method of a semiconductor device as claimed in claim 6, wherein an aspect ratio in the groove-like regions is in a range of 10 to 15.

9. The manufacturing method of a semiconductor device as claimed in claim 6, wherein the oxygen-plasma processing is performed at a temperature in a range of 200 to 300° C.

10. The manufacturing method of a semiconductor device as claimed in claim 6, wherein the oxygen-plasma processing step is performed at a pressure in a range of 0.1 to 10 Torr.

11. The manufacturing method of a semiconductor device as claimed in claim 1, wherein,
   each bit line has an upper surface covered with a cap insulating film and side surfaces covered by a side wall insulating film, and
   in said filling step, the polysilazane covers the side wall insulating film, and the uppermost surface of the cap insulating film.

12. The manufacturing method of a semiconductor device as claimed in claim 1, wherein,
   each bit line has an upper surface covered with a cap insulating film and side surfaces covered by a side wall insulating film, and
   in said filling step, the polysilazane covers the side wall insulating film, and the uppermost surface of the cap insulating film with the polysilazane contacting the upper surface of the SiON film covering the uppermost surface of the cap insulating film.

13. The manufacturing method of a semiconductor device as claimed in claim 1, wherein a content rate of the N in the SiON film is 10 to 20 atom % so that said step of forming the insulating film by reforming the polysilazane by heat treatment forms a $SiO_2$ film as the insulating film, the $SiO_2$ film being reformed controlling occurrence of voids within the $SiO_2$ film.

14. A method comprising:
   forming over an uneven surface of a target a continuous SiON film that contains more O (oxygen) than N (nitrogen), the SiON film being conformable with the uneven surface of the target to provide uneven surface, wherein the target comprises a plurality of adjacent vertical elements, the uneven surface defining groove-like regions on each side of the adjacent vertical elements, the formed continuous SiON film continuously covering inner surfaces of the groove-like regions and uppermost surfaces of the adjacent vertical elements extending between the adjacent groove-like regions;
   spin-coating an insulation solution on the SiON film to substantially planarize the uneven surface by forming a spin-coating filling the groove-like regions and covering an upper surface of the continuous SiON film covering the uppermost surfaces of the adjacent vertical elements extending between the adjacent groove-like regions the adjacent vertical elements extending between the adjacent groove-like regions; and
   performing heat treatment to convert the insulation solution into an insulation film,
   wherein the adjacent vertical elements are adjacent bit lines, and the groove-like regions are regions between the adjacent bit lines.

15. The method as claimed in claim 14, wherein the insulation solution comprises polysilazane.

16. The method as claimed in claim 14, wherein the adjacent vertical elements of the target comprise a plurality of the bit lines formed in substantially parallel to each other over a semiconductor substrate.

17. The method as claimed in claim 14 further comprising, forming a silicon nitride film over the uneven surface as a layer underlying the SiON film.

18. The method of a semiconductor device as claimed in claim 14, wherein,
   each bit line has an upper surface covered with a cap insulating film and side surfaces covered by a side wall insulating film, and
   in said filling step, the polysilazane covers the side wall insulating film, and the uppermost surface of the cap insulating film.

19. The method of a semiconductor device as claimed in claim 14, wherein,
   each bit line has an upper surface covered with a cap insulating film and side surfaces covered by a side wall insulating film, and
   in said filling step, the polysilazane covers the side wall insulating film, and the uppermost surface of the cap insulating film with the polysilazane contacting the upper surface of the SiON film covering the uppermost surface of the cap insulating film.

20. The method of a semiconductor device as claimed in claim 14, wherein a content rate of the N in the SiON film is 10 to 20 atom % so that said step of forming the insulating film by reforming the polysilazane by heat treatment forms a $SiO_2$ film as the insulating film, the $SiO_2$ film being reformed controlling occurrence of voids within the $SiO_2$ film.

* * * * *